US011641188B1

(12) United States Patent
Chakraborty et al.

(10) Patent No.: US 11,641,188 B1
(45) Date of Patent: May 2, 2023

(54) CURRENT-MODE SIGNAL PATH OF AN INTEGRATED RADIO FREQUENCY PULSE GENERATOR

(71) Applicant: International Business Machines Corporation, Armonk, NY (US)

(72) Inventors: Sudipto Chakraborty, Plano, TX (US); John Francis Bulzacchelli, Somers, NY (US); David James Frank, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/564,859

(22) Filed: Dec. 29, 2021

(51) Int. Cl.
*H03K 3/012* (2006.01)
*G06N 10/40* (2022.01)
*H03K 5/1252* (2006.01)

(52) U.S. Cl.
CPC .......... *H03K 3/012* (2013.01); *G06N 10/40* (2022.01); *H03K 5/1252* (2013.01)

(58) Field of Classification Search
CPC ....... H03K 3/012; H03K 5/1252; G06N 10/40
See application file for complete search history.

(56) References Cited

U.S. PATENT DOCUMENTS

| | | |
|---|---|---|
| 7,103,857 B2 | 9/2006 | Nosowicz |
| 10,331,152 B2 | 6/2019 | Jefremow et al. |
| 10,411,687 B2 | 9/2019 | Papriwal et al. |
| 10,461,768 B1 * | 10/2019 | Dong ............. H03M 1/0881 |
| 10,560,060 B2 | 2/2020 | Franck et al. |
| 10,998,912 B2 | 5/2021 | Hou et al. |
| 11,003,201 B1 | 5/2021 | Ahmed et al. |
| 11,079,781 B2 | 8/2021 | Cellucci et al. |
| 2003/0111669 A1 * | 6/2003 | Lin ............... H03K 3/011 257/143 |

(Continued)

OTHER PUBLICATIONS

Saberkari et al., "Output-Capacitorless CMOS LDO Regulator Based on High Slew-Rate Current-Mode Transconductance Amplifier," 2013 IEEE International Symposium on Circuits and Systems (ISCAS), 4 pages.

(Continued)

*Primary Examiner* — Sibin Chen
(74) *Attorney, Agent, or Firm* — Amin, Turocy & Watson, LLP

(57) ABSTRACT

One or more systems, devices and/or methods of use provided herein relate to a device that can facilitate a signal generation. A current-mode end-to-end signal path can include a digital to analog converter (DAC) operating in current-mode and an upconverting mixer, operating in current-mode and operatively coupled to the DAC. Analog inputs and analog outputs of the DAC and the upconverting mixer can be represented as currents, and the DAC can generate a baseband signal. In one or more embodiments, a current source and a diode-connected transistor can be arranged in parallel in the current-mode signal path between a baseband filter and an output stage comprising the upconverting mixer. The device and/or system can be a radio frequency DAC. The diode-connected transistor can be programmable to vary gain and/or can be directly connected to the output stage absent a turnaround current mirror connected therebetween.

25 Claims, 10 Drawing Sheets

(56) References Cited

U.S. PATENT DOCUMENTS

| | | | |
|---|---|---|---|
| 2004/0169540 A1* | 9/2004 | Lorga | H03H 11/265 327/280 |
| 2007/0018707 A1* | 1/2007 | Rajagopal | H03K 5/13 327/231 |
| 2007/0285167 A1 | 12/2007 | Ebner | |
| 2010/0214032 A1* | 8/2010 | Hinrichs | H03K 3/0322 331/57 |
| 2011/0300898 A1 | 12/2011 | Homol et al. | |
| 2019/0188238 A1* | 6/2019 | Oberoi | G06F 7/00 |
| 2019/0372558 A1 | 12/2019 | Choi et al. | |
| 2020/0285262 A1 | 9/2020 | Kunz et al. | |
| 2021/0250002 A1 | 8/2021 | Chang et al. | |

OTHER PUBLICATIONS

Sangeetha et al., "Design of Low Power Modified Wilson Current Mirror Based Level Shifter Using Forced PMOS Method," International Journal of Modem Trends in Engineering and Research (IJMTER), vol. 02, Issue 12, Dec. 2015, 8 pages.

Martinez-Nieto et al., "High-Linearity Self-Biased CMOS Current Buffer," Electronics 2018, vol. 7, Issue 12, 423, 18 pages.

Ni et al., "Low Quiescent Current Capacitor-Less LDO Regulator With High Slew Rate Super Class AB CMOS OTA," Journal of Physics: Conference Series, 1550 (2020) 052022, 7 pages.

Lee et al., "A Low Quiescent Current Low dropout Voltage Regulator With Self-Compensation," Bulletin of Electrical Engineering and Informatics, vol. 8, No. 1, Mar. 2019, 9 pages.

Patra et al., "A Scalable Cryo-CMOS 2-to-20GHz Digitally Intensive Controller for 4×32 Frequency Multiplexed Spin Qubits/ Transmons in 22nm FinFET Technology for Quantum Computers," 2020 IEEE International Solid- State Circuits Conference— (ISSCC), Feb. 16-20, 2020, 3 pages.

Bardin et al., "A 28nm Bulk-CMOS 4-to-8GHz <2mW Cryogenic Pulse Modulator for Scalable Quantum Computing," 2019 IEEE International Solid- State Circuits Conference—(ISSCC), Feb. 17-21, 2019, 3 pages.

Chakraborty et al., "Current Mode Signal Path of an Integrated Radio Frequency Pulse Generator," U.S. Appl. No. 17/354,718, filed Jun. 22, 2021, 45 pages.

Mell et al., "The NIST Definition of Cloud Computing," Recommendations of the National Institute of Standards and Technology, NIST Special Publication 800-145, Sep. 2011, 7 pages.

Chakraborty et al., "Current Mode Transconductance Capacitance Filter Within a Radio Frequency Digital To Analog Converter," U.S. Appl. No. 16/952,723, filed Nov. 19, 2020, 49 pages.

Van Dijk et al., "A Scalable Cryo-CMOS Controller for the Wideband Frequency-Multiplexed Control of Spin Qubits and Transmons," IEEE Journal of Solid-State Circuits, vol. 55, No. 11, Nov. 2020, 17 pages.

List of IBM Patents or Applications Treated as Related Jul. 2022.

* cited by examiner

CURRENT-MODE SIGNAL PATH OF AN INTEGRATED RADIO FREQUENCY PULSE GENERATOR

FIELD OF USE

The present disclosure relates generally to an integrated radio frequency pulse generator system utilizing a current-mode end-to-end signal path.

BACKGROUND

Quantum computing is generally the use of quantum-mechanical phenomena to perform computing and information processing functions. Quantum computing can be viewed in contrast to classical computing, which generally operates on binary values with transistors. That is, while classical computers can operate on bit values that are either 0 or 1, quantum computers operate on quantum bits (qubits) that comprise superpositions of both 0 and 1. Quantum computing has the potential to solve problems that, due to computational complexity, cannot be solved or can only be solved slowly on a classical computer.

SUMMARY

The following presents a summary to provide a basic understanding of one or more embodiments of the invention. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate an integrated radio frequency pulse generator system, and more specifically, utilizing a current-mode end-to-end signal path to reduce power consumption and enhance linearity between a digital to analog converter (DAC) and subsequent stages in a signal chain. This can facilitate realization of a favorable set of trade-offs regarding power consumption and distortion.

In accordance with an embodiment, a device can comprise a baseband filter and an output stage defining a current-mode signal path, and a current source and a diode-connected transistor arranged in parallel in the current-mode signal path, wherein the diode-connected transistor is selectively adjustable to vary gain.

In accordance with another embodiment, a method can comprise outputting a radio frequency output signal by a radio frequency (RF) pulse generator operatively coupled to a quantum processor, wherein the RF pulse generator comprises a baseband filter and an output stage defining a current-mode signal path, and a current source and a diode-connected transistor arranged in parallel in the current-mode signal path, wherein the diode-connected transistor is programmable to vary gain.

In accordance with yet another embodiment, a system can comprise a quantum controller, and a radio frequency (RF) pulse generator controlled by the quantum controller, wherein the RF pulse generator comprises a baseband filter and an output stage defining a current-mode signal path, and a current source and a diode-connected transistor arranged in parallel in the current-mode signal path, wherein the diode-connected transistor is directly connected to the output stage absent a turnaround current mirror connected between the diode-connected transistor and the output stage.

An advantage of the aforementioned device, system and/or method can be ability to employ a lower ratio of static bias to signal current at the output stage as compared to as employed at the baseband filter. Another advantage of the aforementioned device, system and/or method can be the ability to adjust the gain of the current-mode signal path by programming the active width of the diode-connected transistor, so that the gain can be varied over a wide range and/or with fine resolution. In connection therewith, current can be reused, power efficiency can be improved, and distortion products can be reduced, relative to one or more embodiments of an RF pulse generator device not employing the parallel arrangement of a current source and a diode-connected transistor coupled in the current-mode signal path between the baseband filter and the output stage. Further improvements in power efficiency and reductions in distortion products can be achieved by directly connecting the diode-connected transistor to the output stage absent an intermediate stage such as a turnaround current mirror connected between the diode-connected transistor and the output stage.

As a result of the aforementioned advantages, less power relative to operating one or more qubits of a quantum system can be employed. Reduced power consumption can allow for increased scaling of qubits of a quantum system. Furthermore, the components of the device and/or system can be employed within and/or relative to a cryogenic chamber, such as a dilution refrigerator.

In one or more embodiments of the aforementioned device, system and/or method, the current source can pass a static current and the diode-connected transistor can pass both a static current and a dynamic current. A related advantage can be, depending on one or more parameters and/or specifications of the current source and diode-connected transistor employed, an ability to alter the ratio of static bias to signal current between an input and an output of a respective device and/or system. This advantage can be realized absent a turnaround current mirror connected between the diode-connected transistor and the output stage.

In accordance with still another embodiment, a device can comprise a baseband filter and an output stage defining a current-mode signal path, and a current source and a programmable diode-connected transistor arranged in parallel in the current-mode signal path, wherein the output stage comprises a pair of parallelly connected output stage portions, and wherein the programmable diode-connected transistor is directly connected to one of the output stage portions.

An advantage of the aforementioned device can be an ability to employ a lower ratio of static bias to signal current at the output stage as compared to as employed at the baseband filter. In connection therewith, current can be reused, power efficiency can be improved, and distortion products can be reduced, relative to one or more embodiments of an RF pulse generator device not employing the parallel arrangement of a current source and a diode-connected transistor coupled in the current-mode signal path between the baseband filter and the output stage. Further improvements in power efficiency and reductions in distortion products can be achieved by directly connecting the diode-connected transistor to the output stage absent an intermediate stage such as a turnaround current mirror connected between the diode-connected transistor and the output stage.

As a result of the aforementioned advantages, less power relative to operating one or more qubits of a quantum system can be employed. Reduced power consumption can allow for increased scaling of qubits of a quantum system. Furthermore, the components of the device and/or system can be employed within and/or relative to a cryogenic chamber, such as a dilution refrigerator.

Yet another advantage of the aforementioned device can be an ability to dynamically and/or selectively vary gain at the device, so that the gain of the current-mode signal path can be adjusted. The gain of the current-mode signal path can be adjusted over a large range and/or with fine resolution by programming the active width of the diode-connected transistor, as this changes the mirroring gain between the diode-connected transistor and the subsequent stage. This advantage can be realized absent a turnaround current mirror connected between the diode-connected transistor and the output stage.

In accordance with another embodiment, a device can comprise a baseband filter and an output stage defining a current-mode signal path, and a programmable current source and a programmable diode-connected transistor arranged in parallel in the current-mode signal path, wherein the programmable diode-connected transistor is directly connected to the output stage absent a turnaround current mirror connected between the programmable diode-connected transistor and the output stage.

An advantage of the aforementioned device can be an ability to employ a lower ratio of static bias to signal current at the output stage as compared to as employed at the baseband filter. Another advantage of the aforementioned device, system and/or method can be the ability to adjust the gain of the current-mode signal path by programming the active width of the diode-connected transistor, so that the gain can be varied over a wide range and/or with fine resolution. In connection therewith, current can be reused, power efficiency can be improved, and distortion products can be reduced, relative to one or more embodiments of an RF pulse generator device not employing the parallel arrangement of a current source and a diode-connected transistor coupled in the current-mode signal path between the baseband filter and the output stage. Further improvements in power efficiency and reductions in distortion products can be achieved by directly connecting the diode-connected transistor to the output stage absent an intermediate stage such as a turnaround current mirror connected between the diode-connected transistor and the output stage.

As a result of the aforementioned advantages, less power relative to operating one or more qubits of a quantum system can be employed. Reduced power consumption can allow for increased scaling of qubits of a quantum system. Furthermore, the components of the device and/or system can be employed within and/or relative to a cryogenic chamber, such as a dilution refrigerator.

Yet another advantage of the aforementioned device can be an ability to dynamically and/or selectively vary gain at the device, so that the gain of the current-mode signal path can be adjusted. The gain of the current-mode signal path can be adjusted over a large range and/or with fine resolution by programming the active width of the diode-connected transistor, as this changes the mirroring gain between the diode-connected transistor and the subsequent stage. This advantage can be realized absent a turnaround current mirror connected between the diode-connected transistor and the output stage.

In one or more embodiments of the aforementioned devices, the programmable current source can pass a static current and the diode-connected transistor can pass both a static current and a dynamic current. A related advantage can be, depending on one or more parameters and/or specifications of the current source and diode-connected transistor employed, an ability to alter the ratio of static bias to signal current between an input and an output of a respective device and/or system. This advantage can be realized absent a turnaround current mirror connected between the diode-connected transistor and the output stage.

DETAILED DESCRIPTION

Figure 1:
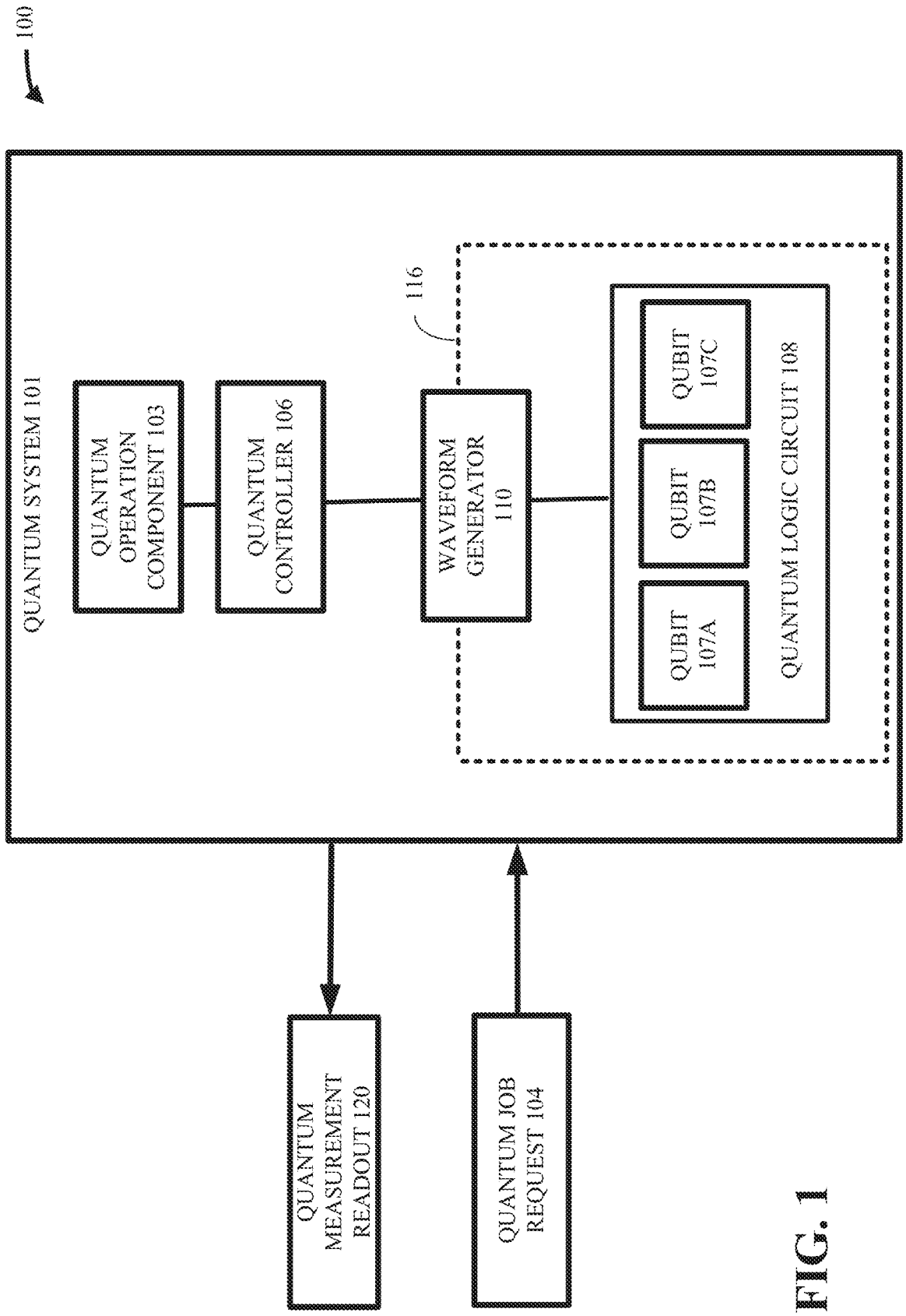
FIG. 1 illustrates a block diagram of an example, non-limiting system that can facilitate operation of one or more qubits, in accordance with one or more embodiments described herein.

The subject embodiments described herein generally relate to an integrated radio frequency (RF) pulse generator and more specifically, to utilizing a current-mode end-to-end signal path to reduce power consumption, reduce distortion and enhance linearity between a digital to analog converter (DAC) and adjacent stages in a signal chain.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Generally, on a large scale, quantum computing cloud service providers can execute millions of quantum jobs for users during a year. Each quantum job can include the execution of one or more quantum programs. Where qubit states only can exist (or can only be coherent) for a limited amount of time, an objective of operation of a quantum logic circuit (e.g., including one or more qubits) can be to reduce the time of the operation and/or increase the speed of the operation. Time spent to operate the quantum logic circuit can undesirably reduce the available time of operation on one or more qubits. This can be due to the available coherence time of the one or more qubits prior to decoherence of the one or more qubits. For example, a qubit state can be lost in less than 100 to 200 microseconds in some cases. Further, operations on qubits generally introduce some error, such as some level of decoherence and/or some level of quantum noise, further affecting qubit availability. Quantum noise can refer to noise attributable to the discrete and/or probabilistic natures of quantum interactions. Device designs that prolong the lifetime of the quantum state and extend the coherence time can be desirable.

Also, on the large scale, a large quantity of quantum jobs can create pressure to execute the respective quantum programs quickly. That is, increased speed of execution can directly and/or indirectly correlate to maximizing system usage, minimizing users having to wait for measurement results, and/or minimizing undesirable consuming of classical computational resources. Pressure also can be created to execute these quantum jobs well, so that a maximum performance can be extracted from near-term error-prone systems, so that a quality of measurements relative to the one or more qubits of the respective quantum systems and/or so that compiling into physical-level pulses can be improved (e.g., related to accuracy, precision and/or measurement efficiency).

Physical, real-world, quantum logic circuits controlled by a quantum system can include a plurality of qubits. One type of qubit, a superconducting qubit, can include a Josephson junction, and operates generally only within a cryogenic chamber, such as a dilution refrigerator. One or more such superconducting qubits can be multiplexed per measurement circuit contained within the cryogenic chamber.

Arbitrary waveform generation capability with variable amplitude and low distortion can be desirable in multiple contexts, including in control of qubits. A key circuit in an arbitrary waveform generator (AWG) can be a digital to analog converter (DAC), which can be valuable in a variety of applications, including wireless transmitters and implementing qubit control pulses. Minimizing power consumption and reducing distortion for such designs can be valuable, especially in context of cryogenic signal generation for qubit control. Challenges with designs that utilize voltage mode representations for a signal path can include high dynamic range requirements at block interfaces, leading to non-linear behavior and the generation of undesired distortion products. Undesired distortion products can be considered a source of noise or disturbances in the system, and thus can contribute to reducing the coherence time of one or more qubits in the cryogenic chamber, for example.

Another challenge can be significant power consumption per block, with no opportunity for power efficiency that comes from current reuse. When scaling a quantum system to include an increased number of qubits, power efficiency can be not only desirable, but also a factor that can enable the scaling to include the increased number of qubits.

More particularly, quantum computation utilizes a qubit as its essential unit instead of a classical computing bit. A qubit (e.g., quantum binary digit) is a quantum-mechanical analog of a classical bit. Whereas classical bits can employ only one of two basis states (e.g., 0 or 1), qubits can employ superpositions of those basis states (e.g., $\alpha|0\rangle + \beta|1\rangle$, where $\alpha$ and $\beta$ are complex scalars (such that $|\alpha|^2 + |\beta|^2 = 1$), allowing several qubits to theoretically hold exponentially more information than the same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, or similar binary-type state measure. Qubits, partaking of the quantum mystique, can occupy a superposition of 0 and 1 states. It is not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1.

Indeed, general quantum programs require coordination of quantum and classical parts of a computation. One way to contemplate general quantum programs is to identify processes and abstractions involved in specifying a quantum algorithm, transforming the algorithm into executable form, running an experiment or simulation, and analyzing the results. A notion throughout these processes is use of intermediate representations. An intermediate representation (IR) of computation is neither its source language description nor target machine instructions, but something in between. Compilers can utilize several IRs during a process of translating and optimizing a program. An input is a source code describing a quantum algorithm and compile time parameter(s). An output is a combined quantum/classical program expressed using a high-level IR. A distinction between quantum and classical computers is that the quantum computer is probabilistic, thus measurements of algorithmic outputs provide a proper solution within an algorithm specific confidence interval. Computation is repeated until a satisfactorily probable certainty of solution can be achieved.

By processing information using laws of quantum mechanics, quantum computers offer novel ways to perform computation tasks such as molecular calculations, optical photons, optimization, and many more. Many algorithms and system components are introduced to perform such computational tasks efficiently. For example, radio frequency (RF) pulse generators (often incorporating one or more digital to analog converters) can be valuable in a variety of applications, including wireless transmitters and implementing control pulses for qubits. There can be one or more challenges with designs that utilize voltage mode representations for a signal path which include high dynamic range requirements at block interfaces, leading to nonlinear behavior and generation of higher amplitude distortion products. Another challenge can be significant power consumption per block, with no opportunity for power efficiency that comes from current reuse. Thus, embodiments herein propose a current-mode end-to-end signal path to facilitate realization of a favorable set of trade-offs regarding power consumption and distortion. These benefits can be best achieved by implementing the entire chain in current-mode.

The one or more embodiments described herein relate generally to RF pulse generator systems and methods that implement a current-mode end-to-end path from a digital to analog converter (DAC) through an output stage which enables realization of a favorable set of trade-offs regarding power consumption and distortion. This can be realized by a device (e.g., radio frequency (RF) pulse generator) and/or portion of the device that can alter the ratio of static (bias) current to dynamic (signal) current at different circuit stages. That is, an input stage of the device can employ a higher ratio of static (bias) current to dynamic (signal) current for sake of better linearity, with the ratio of static (bias) current to dynamic (signal) current being reduced for an output stage of the device. Elements of a signal path of the device can be a DAC, baseband filter, mixer, attenuator, and an output chain component. Benefits can be achieved by implementing an entire chain in current-mode. One or more embodiments optionally can utilize radio frequency digital to analog converters (RFDACs).

Current-mode signal processing is well suited for low distortion applications, as it can reduce voltage swings at various nodes of interest of an employed device, circuit and/or signal path. Another benefit of current-mode circuits is that they can make possible current reuse, in which the bias and signal currents of one stage are shared with another stage (typically by stacking the circuit stages). Since reuse can decrease the total current drawn from the power supply, circuit power efficiency can be improved. Traditional current-mode input filters using an operational amplifier consume significant amount of power and have limitations to high frequency applications. While introducing a current-mode signal path design in implementation of an integrated RF pulse generator can improve the circuit power efficiency, one or more embodiments described herein provide an improved current-mode signal path design that can further improve circuit power efficiency.

That is, implementing an efficient current-mode filter stage can be a key part of realizing a proposed end-to-end current-mode signal path, which has been developed for low-power consumption through leverage of current reuse and enhancing end-to-end linearity by minimizing voltage-to-current and current-to-voltage conversions. Low output signal can be a design construction that can be an advantage to a system in implementing a signal chain efficiently. Moreover, the integrated RF pulse generator solution can enable cascaded solutions using current-mode approaches. Because both the input and output signals of a current-mode filter stage are currents, the filter stages can be cascaded by connecting the output of one filter stage to the input of another filter stage. This cascading of current-mode filter stages can be used to construct higher-order filters (e.g., with sharper roll-off characteristics).

To achieve the reduction in ratio of static (bias) current to dynamic (signal) current, one or more embodiments described herein can employ a circuit device in the signal path between the baseband filter and an output stage of the device, where the output stage can include the mixer, attenuator and output chain component. In particular, one or more embodiments described herein can integrate a pair of components arranged in parallel in the current-mode signal path. Generally, the pair of components can enable splitting of a current from the baseband filter between the pair of components. As a result, a static current can be provided at one component of the pair, such as a current source, and both a static current and a dynamic current can be provided at the other component of the pair, such as a diode-connected transistor.

Placing the parallel combination of a current source and a diode-connected transistor in the current-mode signal path enables realization of a reduced ratio of static (bias) current to dynamic (signal) current at the output stage (e.g., mixer and attenuator) as compared to at the baseband filter. In contrast, the ratio of static (bias) current to dynamic (signal) current cannot be altered with a simple current mirror, as such a mirror scales up or down both the static (bias) current and the dynamic (signal) current by the same factor. This decoupling of the static current of the baseband filter from the static current of the output stage can provide one or more advantages in the realization of a high performance yet power-efficient RF pulse generator. For example, operating the baseband filter with a large ratio of static (bias) current to dynamic (signal) current may improve its distortion performance, but operating the output stage at such a large ratio reduces its power efficiency, which is important since the output stage often dominates the power consumption of the system. Decoupling of the static current of the baseband filter from the static current of the output stage allows the former to be operated with high linearity and low distortion and the latter to be operated with good power efficiency, so that a better trade-off between distortion performance and power consumption can be achieved for the system. Making the diode-connected transistor programmable (i.e., with switchable active width) provides a gain control mechanism for the current-mode signal path, which is another advantage of the topology.

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. It is evident, however, in various cases, that the one or more embodiments can be practiced without these specific details.

Embodiments depicted in one or more figures described herein are for illustration only, and as such, the architecture of embodiments is not limited to the systems, devices and/or components depicted therein, nor to any particular order, connection and/or coupling of systems, devices and/or components depicted therein. For example, in one or more embodiments, the non-limiting systems described herein, such as non-limiting system 100 as illustrated at FIG. 1, and/or systems thereof, can further comprise, be associated with and/or be coupled to one or more computer and/or computing-based elements described herein with reference to an operating environment, such as the operating environment 800 illustrated at FIG. 8. In one or more embodiments, computer and/or computing-based elements can be used in connection with implementing one or more of the systems, devices, components and/or computer-implemented operations shown and/or described in connection with FIG. 1 and/or with other figures described herein.

Turning first generally to FIG. 1, one or more embodiments described herein can include one or more devices, systems and/or apparatuses that can facilitate executing one or more quantum operations to facilitate output of one or more quantum results. For example, FIG. 1 illustrates a block diagram of an example, non-limiting system 100 that can enhance execution of a quantum job, such as by enhancing power consumption relative to arbitrary waveform generation relative to the quantum job.

The quantum system 101 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 120, can be responsive to the quantum job request 104 and associated input data and can be based at least in part on the input data, quantum functions and/or quantum computations.

In one or more embodiments, the quantum system 101 can comprise one or more quantum components, such as a quantum operation component 103, a quantum controller 106, a waveform generator 110, and a quantum logic circuit 108 (also herein referred to as a quantum processor), comprising one or more qubits, e.g., qubits 107A, 107B and/or 107C (also herein referred to as qubit devices 107A, 107B and 107C).

The quantum controller 106 can comprise any suitable processor. The quantum controller 106 can generate one or more instructions for controlling the one or more processes of the quantum operation component 103 and/or for controlling the quantum logic circuit 108 and/or waveform generator 110.

The quantum operation component 103 can obtain (e.g., download, receive, search for and/or the like) a quantum job request 104 requesting execution of one or more quantum programs. The quantum operation component 103 can determine one or more quantum logic circuits, such as the quantum logic circuit 108, for executing the quantum program. The request 104 can be provided in any suitable format, such as a text format, binary format and/or another suitable format. In one or more embodiments, the request 104 can be received by a component other than a component of the quantum system 101, such as a by a component of a classical system coupled to and/or in communication with the quantum system 101.

The waveform generator 110 can perform one or more quantum processes, calculations and/or measurements for operating one or more quantum circuits on the one or more qubits 107A, 107B and/or 107C. For example, the waveform generator 110 can operate one or more qubit effectors, such as qubit oscillators, harmonic oscillators, pulse generators and/or the like to cause one or more pulses to stimulate and/or manipulate the state(s) of the one or more qubits 107A, 107B and/or 107C comprised by the quantum system 101. That is, the waveform generator 110, such as in combination with the quantum controller 106, can execute operation of a quantum logic circuit on one or more qubits of the circuit (e.g., qubit 107A, 107B and/or 107C). In response, the quantum operation component 103 can output one or more quantum job results, such as one or more quantum measurements 120, in response to the quantum job request 104.

As will be described below in further detail, the waveform generator 110 can comprise a current-mode device that reduces a ratio of static bias to signal current along a signal path of the current-mode device. This reduction in ratio between a baseband filter and an output stage of the device can reduce distortion and/or increase power efficiency relative to one or more waveform and/or signal generations of the quantum system 101.

The quantum logic circuit 108 and a portion or all of the waveform generator 110 can be contained in a cryogenic environment, which can be provided with a cryogenic chamber 116, such as a dilution refrigerator. Indeed, a signal can be generated by the waveform generator 110 within the cryogenic chamber 116 to manipulate and/or control the one or more qubits 107A-C. Where qubits 107A, 107B and 107C are superconducting qubits, cryogenic temperatures, such as about 4K or lower can be employed to facilitate function of these physical qubits. Accordingly, the elements of the waveform generator 110 also are to be constructed to perform at such cryogenic temperatures.

The following/aforementioned description(s) refer(s) to the operation of a single quantum program from a single quantum job request. However, one or more of the processes described herein can be scalable, such as execution of one or more quantum programs and/or quantum job requests in parallel with one another.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function in combination with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

Figure 2:
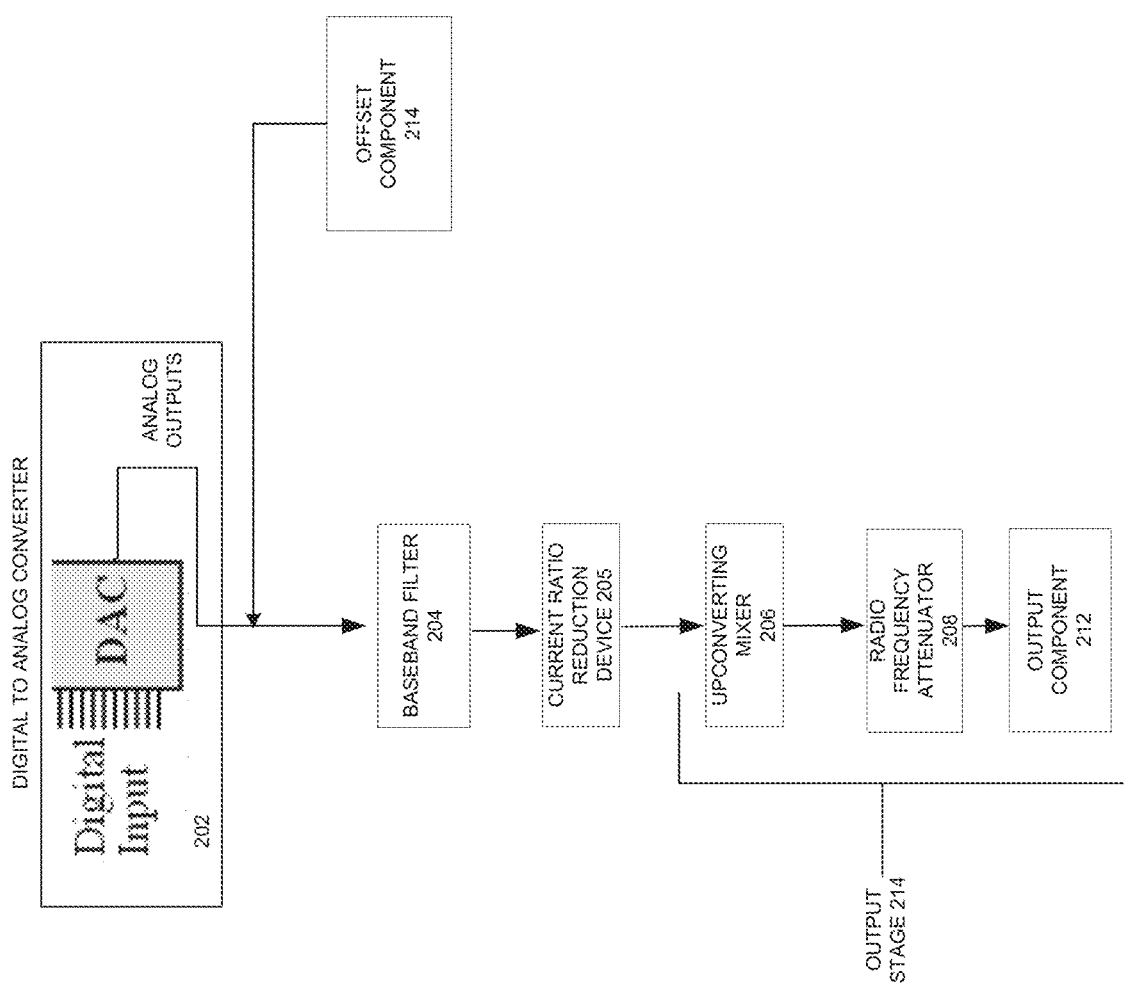
FIG. 2 illustrates a block diagram of an example system implementation that implements an integrated radio frequency (RF) pulse generator utilizing a current-mode signal path.

FIG. 2 illustrates a block diagram of an example non-limiting system 200 (also herein referred to as a device) that can be comprised by the waveform generator 110 of the quantum system 101 of the non-limiting system 100 of FIG. 1. The non-limiting system 200 can access data and process that data using variable computing components depicted in accordance with one or more embodiments described herein. Portions of systems (e.g., non-limiting system 200 and the like), apparatuses or processes explained herein can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform operations described herein. Repetitive description of like elements employed in one or more embodiments described herein is omitted for sake of brevity.

Generally, the subject computer processing system(s), methods, apparatuses and/or computer program products can be employed to solve new problems that can arise through advancements in technology, computer networks, the Internet and the like.

In today's digital world, one of the largest growth areas in electronics has been in applications of wireless communications. Modern radio frequency systems such as 3G/4G/5G base stations are based on wideband multi-channel architectures. To facilitate flexibility in signal generation, modulation, and processing, modern RF transmitters typically employ one or more high-speed digital to analog converters (DACs). Such high-speed DACs provide arbitrary waveform generation capability for RF signals, which can be useful in both quantum-related and non-quantum related applications, as indicated above.

One such quantum-related application can be the control of qubits in the field of quantum computing, where there is a desire for generating RF control pulses with variable amplitudes and low distortion (high spectral purity). Minimizing power consumption for such RF pulse generators is valuable, especially in the context of cryogenic signal generation for qubit control. A challenge with designs that utilize voltage mode representations for the signal path includes high dynamic range requirements at block interfaces, leading to nonlinear behavior and the generation of higher amplitude distortion products. Thus, these embodiments propose a promising solution to this problem by introducing a current-mode signal path design in the implementation of an integrated RF pulse generator system, and for example, a system and/or device that can provide current reuse, and thus power efficiency improvement and/or related distortion reduction as compared to existing techniques.

The non-limiting system 200 can facilitate an integrated radio frequency (RF) pulse generator utilizing a current-mode signal path. Embodiments described herein relate to maintaining elements of a signal path, a digital to analog converter (DAC) 202, baseband filter 204, current ratio reduction device 205, upconverting mixer 206, radio frequency (RF) attenuator 208, an output component 212 (e.g., a current-mode amplifier), and an offset component 214. The radio frequency (RF) attenuator 208 and an output component 212 together can be regarded as at least a portion of an output stage 214 of the non-limiting system 200. In one or more embodiments, the upconverting mixer 206 can be considered as at least a portion of the output stage 214. Benefits can be achieved by implementing an entire chain in current-mode. Although FIG. 2 depicts utilization of the upconverting mixer 206 and the RF attenuator 208, together, other embodiments can omit one or more of these components as well as cascade respective components in any suitable manner.

Non-limiting system 200 can optionally include a server device, one or more networks and one or more devices (not shown) and/or such elements can be comprised more generally by the quantum system 101, where the non-limiting system 200 is comprised by such quantum system 101.

The non-limiting system 200 can also include or otherwise be associated with the digital to analog converter 202 operating in current-mode wherein analog inputs and analog outputs of system blocks are represented as currents. The digital signal input to the DAC 202 can be, for example, baseband digital in-phase and quadrature data (I and Q data) representing any suitable signals such as, for example, signals for a wireless transmitter, signals for implementing control pulses for qubits, etc., but are not limited to such. The analog output of DAC 202 in the form of a current can be directed to a baseband filter 204. The baseband current output of the baseband filter 204 can be frequency translated up to RF frequencies by an upconverting mixer 206, which can be driven by a local oscillator (LO) signal. Optionally the LO signal waveform can use complementary metal-oxide-semiconductor (CMOS) rail-to-rail levels, such as those generated by a CMOS inverter.

The radio frequency (RF) attenuator 208 can operate with the DAC 202, baseband filter 204, and the upconverting mixer 206. Output component 212 receives an output current of the RF attenuator 208. In one or more embodiments, the output component 212 can include an impedance conversion component (e.g., a transformer or current-mode amplifier). The corresponding signal chain can produce an output current signal with the DAC 202, baseband filter 204, the upconverting mixer 206, and the RF attenuator 208. Direct current (DC) offsets in the baseband signals (for instance, DC offsets in the output currents of the baseband filter 204) can be converted by the upconverting mixer to unwanted LO tones (LO "leakage") in the output of the RF pulse generator system 200. To suppress such LO leakage, DC offset cancellation can be applied by an offset component 214, which adds a compensating DC offset to the baseband signal. The DAC 202, the baseband filter 204, the current ratio reduction device 205, the upconverting mixer 206, the RF attenuator 208, the output component 212 and/or the offset component 214 can be cryo-electronic component(s) (e.g., electronic component(s) that can operate at cryogenic temperatures).

In an implementation, a current-mode end-to-end path from the digital to analog converter (DAC) 202 through output component 212 can facilitate realization of a favorable set of trade-offs regarding power consumption and distortion. In this signal path, the DAC 202 operating in current-mode can implement an integrated DAC solution wherein the baseband filter 204 incorporated with upconverting mixer 206 and RF attenuator 208 can operate in current-mode wherein analog input and analog output signals between system blocks can be represented as currents. The upconverting mixer 206 can be driven by an LO signal, which optionally may use complementary metal-oxide-semiconductor (CMOS) rail-to-rail levels. The radio frequency (RF) attenuator 208 can operate with the DAC 202, baseband filter 204, current ratio reduction device 205 and the upconverting mixer 206. This methodology can facilitate low output signal requirements to implement the signal chain efficiently, particularly in view of the current ratio reduction device 205, to be described in detail below. Thus, the current-mode signal path of an integrated RF pulse generator solution may facilitate reduced power consumption through leverage of current reuse, enhance linearity by minimizing voltage-to-current and current-to-voltage conversions, and enable cascaded solutions using current-mode approaches.

Figure 3:
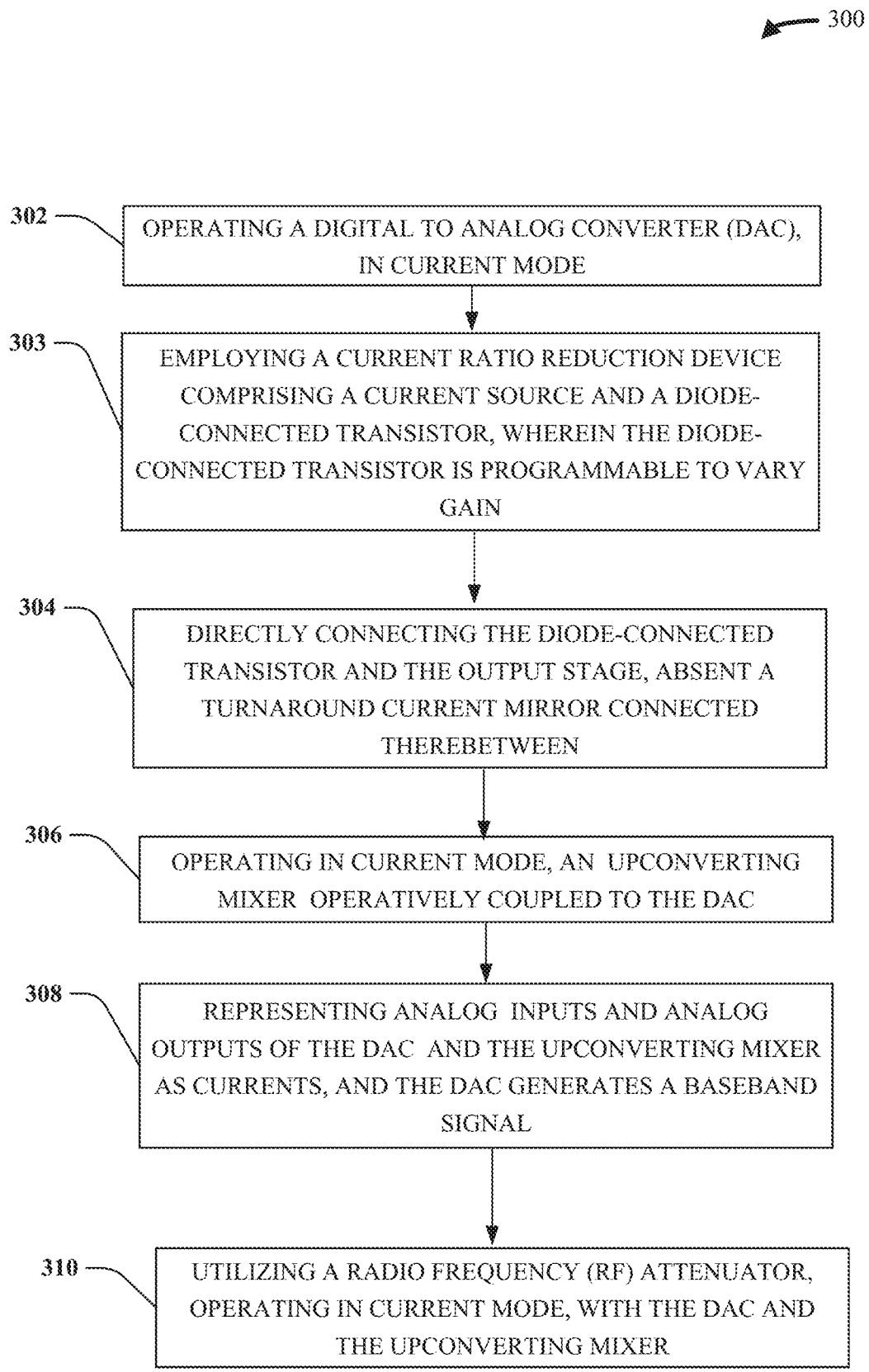
FIG. 3 illustrates an example framework of a methodology to integrate a radio frequency (RF) pulse generator utilizing a current-mode end-to-end signal path.

FIG. 3 illustrates an example framework 300 of a methodology to integrate a radio frequency (RF) pulse generator utilizing a current-mode end-to-end signal path. Facets of the framework are operating a digital to analog converter (DAC) in current-mode at 302, at 303 employing a current ratio reduction device comprising a current source and a diode-connected transistor, wherein the diode-connected transistor is programmable to vary gain. At 304 a facet comprises directly connecting the diode-connected transistor and the output stage, absent a turnaround current mirror connected therebetween. At 306, a facet comprises operating in current-mode an upconverting mixer operatively coupled to the DAC. At 308, a facet comprises representing analog inputs and analog outputs of the DAC and the upconverting mixer as currents, and the DAC generates a baseband signal. At 310, the methodology utilizes a radio frequency (RF) attenuator, operating in current-mode, with the DAC and the upconverting mixer. Steps 304, 306 and/or 308, and/or one or more subsets thereof can be optional. Thus, the framework can provide for an entire chain that operates in current-mode (or optionally implements sub-elements of the chain in current-mode) by integrating a DAC interface to an upconverting mixer, and RF attenuator to generate an output. Functionality can be implemented in current-mode and any two blocks can also be interfaced in current-mode. A stage can utilize current-mode signals and the signals can be attenuated and multiplied. Starting from the baseband filter, the current-mode signals can be scaled up/down in the circuit stages, such as employing the current ratio reduction device 205, at the interfaces between stages, and optionally in an impedance matching network wherein the impedance matching network is part of an output component stage. These methods can reduce end-to-end power consumption through leverage of current reuse and enhance end-to-end linearity (reduce distortion) by minimizing voltage-to-current and current-to-voltage conversions. Low output signal requirements can aid to implement the signal chain efficiently, and the methods can enable cascaded solutions using current-mode approaches.

Figure 4:
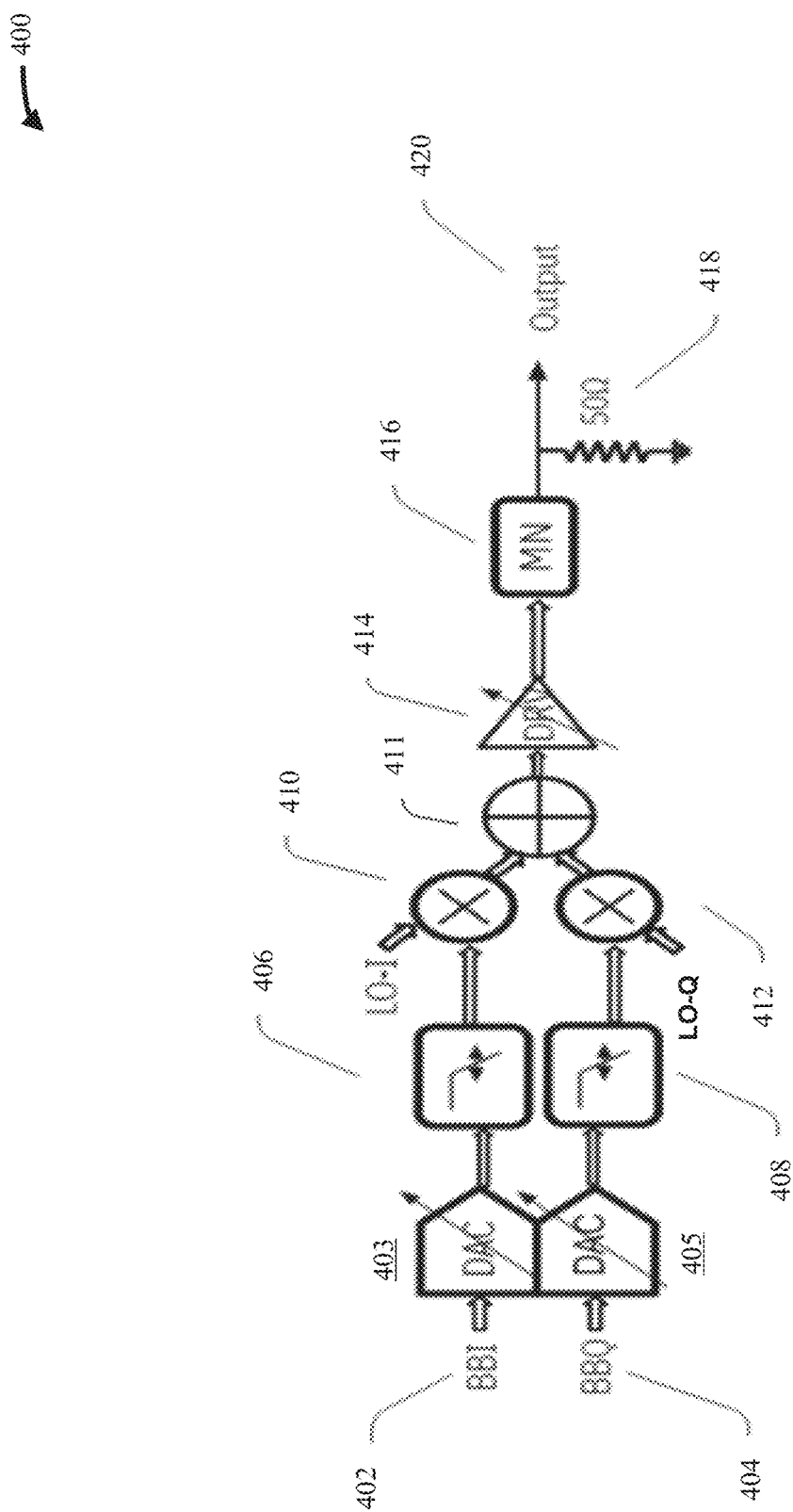
FIG. 4 illustrates an example architecture of a radio frequency (RF) pulse generator signal chain.

FIG. 4 illustrates an example architecture of an RF pulse generator signal chain including two or more DACs (403, 405) in quadrature, two or more base-band filters 406, 408 in quadrature, two or more upconverting mixers (410, 412) in quadrature and a summer 411 that generates a summed output of respective output signals of the upconverting mixers. In this embodiment, and unlike conventional systems, respective subblocks can be implemented in current-mode and all analog signals transferred between subblocks are represented as currents. Inputs (e.g., digital words) to the DACs (403, 405) are digital.

One method to generate complex signals can be to modulate a carrier signal frequency by a local oscillator using a vector modulator. In RF applications, baseband digital I and Q signals are generated using arbitrary waveform generators (AWGs) which contain two or more synchronized digital to analog converters (DACs). An RF pulse generator signal chain architecture 400 can receive baseband digital in-phase signal (BBI signal) 402 and baseband digital quadrature signal (BBQ signal) 404. Multi-bit baseband digital to analog converters (DACs) 403 and 405 can employ digital bits and depending on the bandwidth of a signal and a sampling clock frequency, convert digital bits to an analog signal. This can enable the output of a current and provides a filtered and amplified current to the upconverting mixers 410 and 412.

Signals can be processed through low pass filters 406 and 408 to reject out-of-band noise components resulting from the DACs (403, 405). The filtered signals can be mixed and thus upconverted, by upconverting mixers 410 and 412, using two carriers (LO-Q and LO-I) having orthogonal phases 0 and 90 degrees for I and Q. Using a signal combiner 411, the resulting signals can be combined by creating a single side band signal representation. For example, if (x*y) function needs to be performed in a single side band representation, then variable x can be represented as a combination of 0 and 90 degrees and variable y can be represented as a combination of 0 and 90 degrees. These two variables can then be multiplied and added, similar to the scalar product of two vectors. An output of this function can be processed through a driver (DRV) 414.

A matching network (MN) 416 is a component typically consisting of passive elements that do not add distortions. The matching network 416 can transform resistance 418 (e.g., 50 ohms) to an impedance the driver requires, in order to maximize power transfer.

In the RF pulse generator system 400, the outputs of the DACs (403, 405) can be filtered and up-converted using I- and Q-channel mixers, and resulting signals are combined and fed through a driver and matching network to a nominal load (e.g., 50 ohm) at output 420.

The filter implementation and the interface between the filter and the other elements of the signal chain can be useful in such designs. Continuous-time filters can be well suited for high dynamic range, low power active filter implementations. Traditional current-mode input filter using an operational amplifier can consume a significant amount of power and can have limitations in high frequency applications. Continuous time transconductance ($G_m$)-capacitance (C) filters ($G_m$-C filters) typically can provide a high input impedance, which can lead to higher distortion products. A $G_m$-C type filter is well suited for high frequency applications but can be limited in terms of the dynamic range it supports as its input is typically a voltage.

Current-mode signal processing can be well suited for low distortion applications, as it reduces voltage swings at various nodes of interest. Another benefit of current-mode circuits can be current reuse, in which bias and signal currents of one stage are shared with another stage (e.g., typically by stacking circuit stages). Since reuse can decrease total current drawn from a power supply, circuit power efficiency can be improved. However, conventional current-mode input filters, e.g., using an operational amplifier, can consume significant amount of power and can have limitations to high frequency applications. For example, a baseband filter can be operated at a relatively high bias current for the sake of linearity, and thus low distortion. However, an output stage in the respective signal path, when operated at a same or similar high ratio of quiescent (bias) current to dynamic (signal) current can waste current and therefore power. It would be desirable to operate the baseband filter at a relatively high bias current, but to operate an output stage in the signal path at a lower ratio of quiescent (bias) current to dynamic (signal) current to improve power efficiency of the overall device/system. An efficient current-mode filter stage can facilitate realizing an end-to-end current-mode signal path for low-power consumption through leverage of current reuse and can enhance end-to-end linearity by minimizing voltage-to-current and current-to-voltage conversions. Low output signal requirements can be an advantage to implementing a signal chain efficiently.

Figure 5:
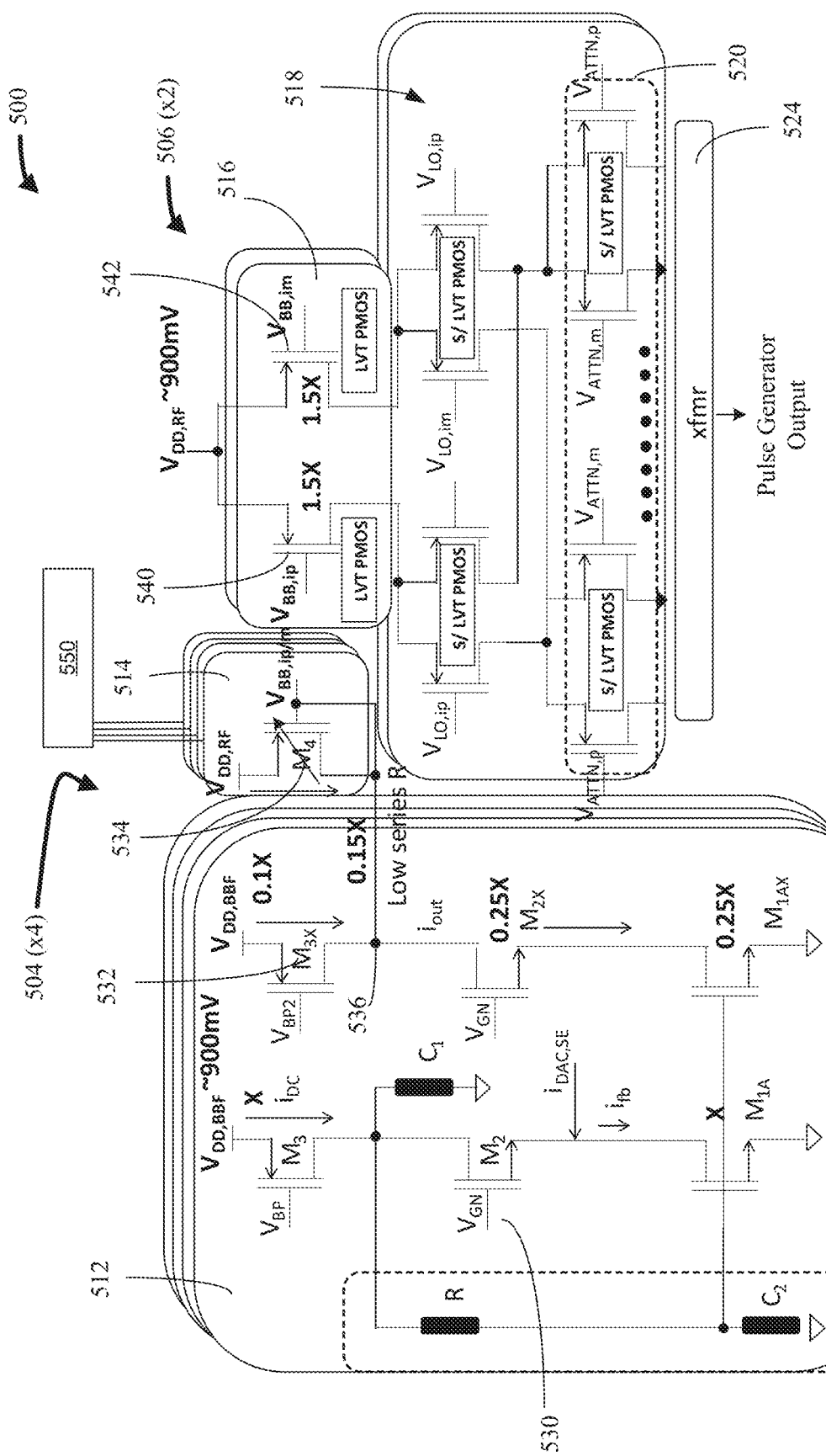
FIG. 5 illustrates an example schematic of a current-mode implementation of the end-to-end signal path from output of the digital-to-analog converter (DAC) to output of the RF pulse generator.

FIG. 5 illustrates an example schematic of a transistor level implementation of a device 500, such as an RF pulse generator system for generating I- and Q-phase RF output signals. Generally, as will be described below, the device 500 can provide a fully-current-mode signal chain that can be tuned to one or more requirements of cryogenic waveform generation, such as relative to a quantum computing system. Again, the one or more embodiments described herein also can be practiced outside of the quantum environment, such as relative to wireless transceivers used in internet of things, sensors and/or memory arrays, where very low power consumption may be critically important to the application.

The device 500 can define a current-mode signal path including one or more input stages and one or more output stages. As illustrated, parallel copies of an input stage 504 can be employed to generate in-phase (I) and quadrature (Q) RF signal components (e.g., providing P and N current polarities for each I and Q signal component). That is, four parallel input stages 504 can be employed together with a pair of output stages 506 (one for the I signal component, one for the Q signal component) to provide an RF pulse generator device 500. A pair of input stages 504 can be coupled to each output stage 506. For example, input stages 504 relative to the P and N current polarities for the I signal component can be coupled to a common output stage 506. As indicated in the figure, the current consumption of each input stage 504 is 1.25X, where X is the bias current of the current source device $M_3$. Since there are four parallel input stages 504, the total baseband filter current is 5X, where X can be equal to about 200 µA.

Each input stage 504 can comprise a baseband filter 512 and a ratio reduction device 514, which can be used to reduce the ratio of static (bias) current to dynamic (signal) current fed to the output stage 506 relative to the ratio of static (bias) current to dynamic (signal) current employed in the baseband filter 512 itself. Each output stage 506 can comprise a transistor pair 516 that receives voltages ($VBB_{ip/m}$) from the ratio reduction device 514, an upconverting mixer 518, and an RF attenuator 520. The output stages 506 can be coupled to a common transformer (xmfr) 524, serving as the output component to the current-mode signal path.

Turning first to the baseband filter 512, the baseband filter 512 shown in FIG. 5 can be similar to a conventional Gm-C filter, in that its frequency response can depend on the values of transconductance ($G_m$) and capacitance (C). For the baseband filter 512 shown in FIG. 5, two poles are provided with two capacitors ($C_1$ and $C_2$) so that a second-order transfer function is realized. An output current is obtained from the baseband filter 512 by mirroring the current through transistor $M_{1A}$ to another transistor $M_{1AX}$, which operates at equal current density (as in most current mirror circuits). If the width of transistor $M_{1AX}$ is one-fourth that of transistor $M_{1A}$, the output current of baseband filter 512 can be 4× smaller than the current through transistor $M_{1A}$. Note that the static (bias) current and the dynamic (signal) current are both reduced by 4×, so standard current mirrors such as the one formed by $M_{1A}$ and $M_{1AX}$ do not change the ratio of static (bias) current to dynamic (signal) current.

Turning next to the ratio reduction device 514, the device includes components $M_{3X}$ and $M_4$. In one or more embodiments, the components $M_{3X}$ and $M_4$ can be located at a same sub-component, chip portion and/or the like. That is, in one or more embodiments, one or more of the components $M_{3x}$ can be located at the respective baseband filter 512 but should not be considered as a component of the respective baseband filter 512. In one or more other embodiments, one or more of the components $M_{3x}$ can be located other than at the respective baseband filter 512, such as at a same sub-component, chip portion and/or the like as the component $M_4$.

Still referring to the ratio reduction device 514, included can be a current source device (also referred to as a current source) 532 ($M_{3x}$) and a diode-connected transistor 534 ($M_4$) arranged in parallel in the current-mode signal path. The current source device 532 can be a simple PMOS transistor biased in saturation (shown in FIG. 5 as $M_{3x}$), a transistor current source with resistive degeneration in its source leg, or a cascaded current source. It is also possible to swap device types, positive (PMOS) versus negative (NMOS) in the implementation of the baseband filter 512 and/or the output stage 506, in which case current source device 532 may be implemented with NMOS devices. The diode-connected transistor 534 can comprise a self-biased diode. Switches can be employed to activate selectively the fingers of the diode-connected transistor 534, so that its active width can be adjusted by digital control. Changing the active width of diode-connected transistor 534 alters the current mirror gain between diode-connected transistor 534 and transistor pair 516, thereby providing a gain control mechanism for the current-mode signal path. Additional gain control adjustments can be realized by activating selectively the fingers of the transistor pair 516, thereby changing their active widths. Providing multiple mechanisms for adjusting gain control can be useful for increasing the range or resolution of the gain control.

Current to the ratio reduction device 514 can be split, such as at 536. The current source 532 can pass a static current and the diode-connected transistor 534 can pass both a static current and a dynamic (signal) current. That is, the current source 532 can carry a majority of the static current from the respective baseband filter 512, while the diode-connected transistor 534 can carry almost all the dynamic current from the respective baseband filter 512. Put another way, dynamic and static current can be partitioned between the current source device 532 and the diode-connected transistor 534 such that the current fed to the output stages 506 can include a reduced portion of the static current component from the filter stages (e.g., baseband filters 512). That is, the ratio of static bias to dynamic (signal) current can be lower at the output stages 506 in view of the employment of the ratio reduction device 514.

The transistor sub-devices 516 can each receive voltage from a pair of the ratio reduction devices 514, as indicated above. The transistor sub-devices 516 each can comprise a pair of transistors 540 and 542. These transistors 540 and 542 can be of a same NMOS or PMOS type as a type (PMOS or NMOS) of the diode-connected transistor 534 of the ratio reduction device 514. If transistors 540 and 542 have the same device type as the type used in diode-connected transistor 534, the diode-connected transistor 534 can be directly connected to the output stage 506 absent an intermediate stage such as a turnaround current mirror connected between the diode-connected transistor 534 and the output stage 506. Since every circuit stage introduces at least a small degree of nonlinearity, eliminating a turnaround current mirror reduces signal distortion and eliminates the power dissipation of the turnaround stage.

A pair of output stages 506 can each comprise an upconverting mixer 518 and an attenuator 520. Both the upconverting mixer 518 and the attenuator 520 operate in current mode and are passed current from a respective transistor sub-device 516.

Employing the ratio reduction devices 514, current at the current source device 532 can be set to about 0.1×, for example, so that the static current flowing through the diode-connected transistor 534 equals 0.25×–0.1×=0.15×. In the example embodiment of FIG. 5, the sizes of diode-connected transistor 534, transistor 540, and transistor 542 are chosen so that there is a current gain of 10 between the diode-connected transistor 534 and each transistor 540 or 542. Therefore, the static currents flowing through transistors 540 and 542 can be about 1.5× (10 times 0.15×).

Absent employment of the ratio reduction devices 514 between the baseband filters 512 and the output stages 506 (e.g., including the transistor sub-devices 516, mixer 518 and attenuator 520), the currents flowing through transistor sub-devices 516 would be much higher. For instance, consider setting the current at the current source device 532 to zero. In this case, all of the static current (0.25×) from the output of the baseband filter 512 would flow through the diode-connected transistor 534, and with a mirroring gain of 10, the static currents flowing through transistors 540 and 542 would be about 2.5×. Since the static current consumption is increased by about 66.7%, the power efficiency of the output stage 506 is significantly degraded. The higher static currents may also lead to headroom problems in the output stage 506, which may cause undesirable increases in signal distortion. As this numerical example shows, decoupling the static current from the baseband filters 512 from the static current of the output stages 506 enables the output stages to operate with a lower ratio of static (bias) current to dynamic (signal) current than the ratio employed in the baseband filters 512.

In one or more embodiments, one or both of the current source 532 and the diode-connected transistor 534 can be programmable, such as tunable. This can allow further dynamic and/or on-the-fly tuning of the ratio of static to dynamic current to more tightly control power efficiency and performance (e.g., related to distortion) of the circuit. In a case where only the current source 532 is programmable, only the static current passed by the current source 532 would be selectively controlled. In that case, the ratio of static to dynamic current could be tuned to provide an optimum balance between power efficiency and signal distortion, but there would be no mechanism for adjusting the gain of the current-mode signal path. In a case where only the diode-connected transistor 534 is programmable, the gain of the current-mode signal path can be selectively controlled, but there would be no mechanism for tuning the ratio of static to dynamic current in the output stage 506. Making both current source 532 and diode-connected transistor 534 programmable provides mechanisms for both gain control and for tuning the ratio of static to dynamic current in the output stage 506. As indicated in FIG. 5, programmability can be provided by suitable configuration electronics 550. All such configuration electronics are envisioned. An advantage of the programmability can be tuning the ratio of static bias to signal current prior to cryogenic waveform generation, for example.

Figure 6:
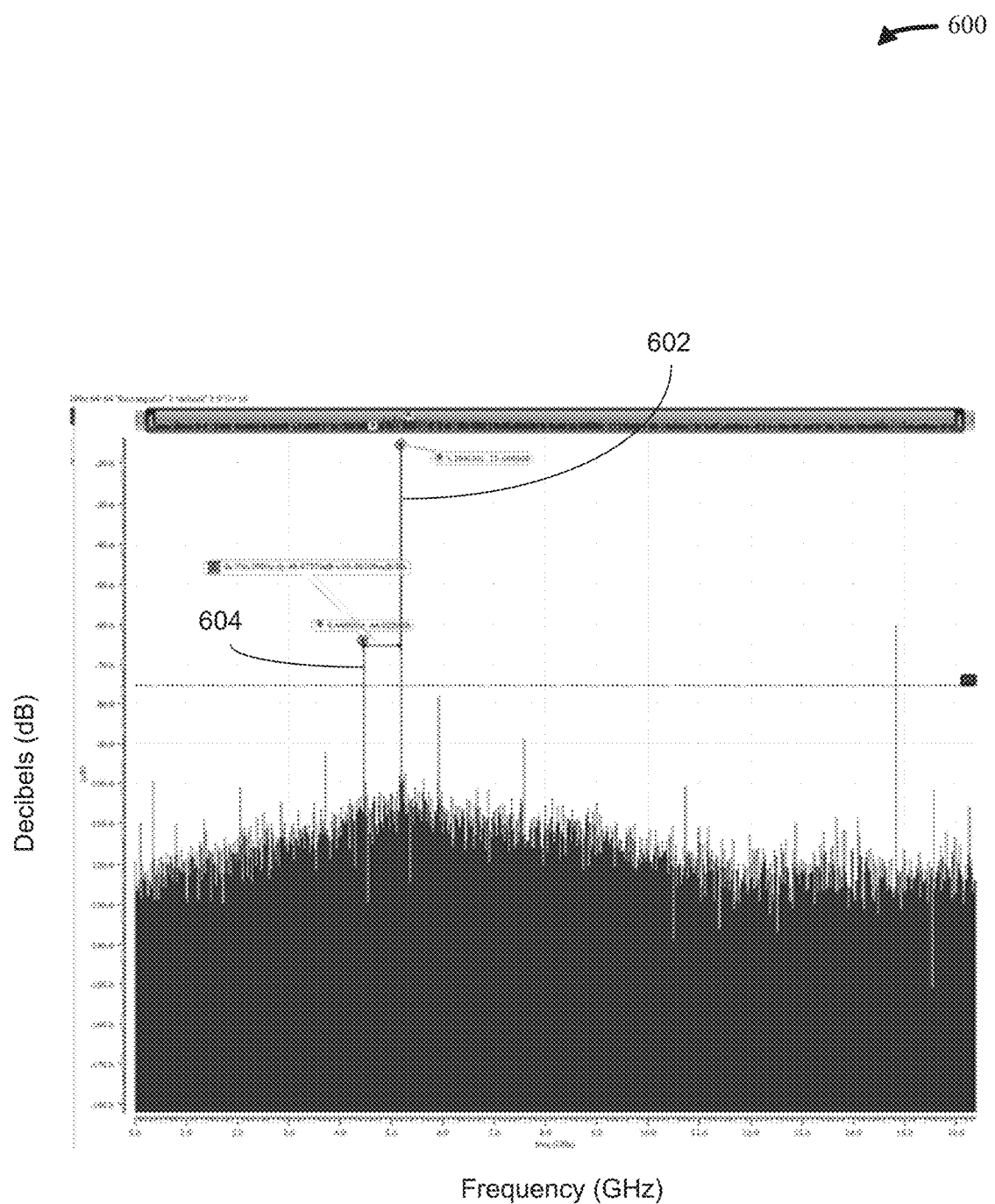
FIG. 6 illustrates an example simulation result of an overall radio frequency (RF) pulse generator signal chain.

FIG. 6 illustrates an example simulation result of distortion performance at the radio frequency output relative to a device according to one or more embodiments described herein. The device, such as the device 500, can employ a ratio reduction component/device to reduce the ratio of static bias to signal current in the output stage of the device. The spectrum shown in the figure is obtained by performing a fast Fourier transform (FFT) of the output signal. In the circuit simulation, a 10-bit DAC operating at a sampling rate of 1 GHz generates a 184 MHz sinusoid that is applied as an input to the current-mode end-to-end signal path. The upconverting mixer is driven by a 5 GHz LO signal. The I and Q signals are chosen to produce an upper sideband tone at a frequency 5.0+0.184=5.184 GHz. As shown in the simulation result 600, over a 1 GHz-wide band (4.5 GHz to 5.5 GHz), the largest distortion product 604 is 48 dB below the desired tone 602, so the simulated spur-free dynamic range (SFDR) is approximately 48 dB. The simulated SFDR number represents excellent performance, especially for such a power-efficient implementation. Conventional techniques have implemented similar functionalities with voltage mode single sideband (SSB) up-converter, voltage gated RF attenuator, operational transconductance amplifier (OTA) based baseband filter, and standard high input impedance $G_m$-C filter implementation. The voltage mode SSB up-converter causes non-linearity. An OTA based baseband filter implementation uses higher power and area. Lastly, a standard high input impedance $G_m$-C filter implementation is more non-linear compared to a filter topology using OTA with negative feedback. However, embodiments disclosed herein facilitate cascaded solutions using current-mode approaches and enable an input current-mode interface. Moreover, embodiments proposed here enhance end-to-end linearity and reduce distortion by minimizing voltage-to-current and current-to-voltage conversions. These approaches can reduce end-to-end power consumption through current reuse.

That is, the current-mode embodiments provided herein can offer a path to current reuse and low distortion that can be well-tuned to the requirements of cryogenic waveform generation. In one or more embodiments, in contrast to existing techniques, a ratio of static bias to signal current can be reduced between a baseband filter and an output stage of the current-mode signal path. In one or more embodiments, the ratio of static bias to signal current can be selectively and dynamically varied. In addition, in one or more embodiments, the gain of the current-mode signal path can be adjusted with the same circuit used to vary the ratio of static bias to signal current. One or more embodiments described herein can be suitable for quantum-based applications, such as waveform generation for controlling one or more qubits, such as superconducting qubits. Techniques described herein can be applicable to other high bandwidth communication systems as well and can be implemented in commercially available CMOS technologies. The approaches of one or more exemplary embodiments described herein can provide an innovative strategy for implementing CMOS control pulse generation analog circuits to enable enhanced scalability of future quantum computing systems and can thus serve as a building block for cryo-CMOS implementations.

Figure 7:
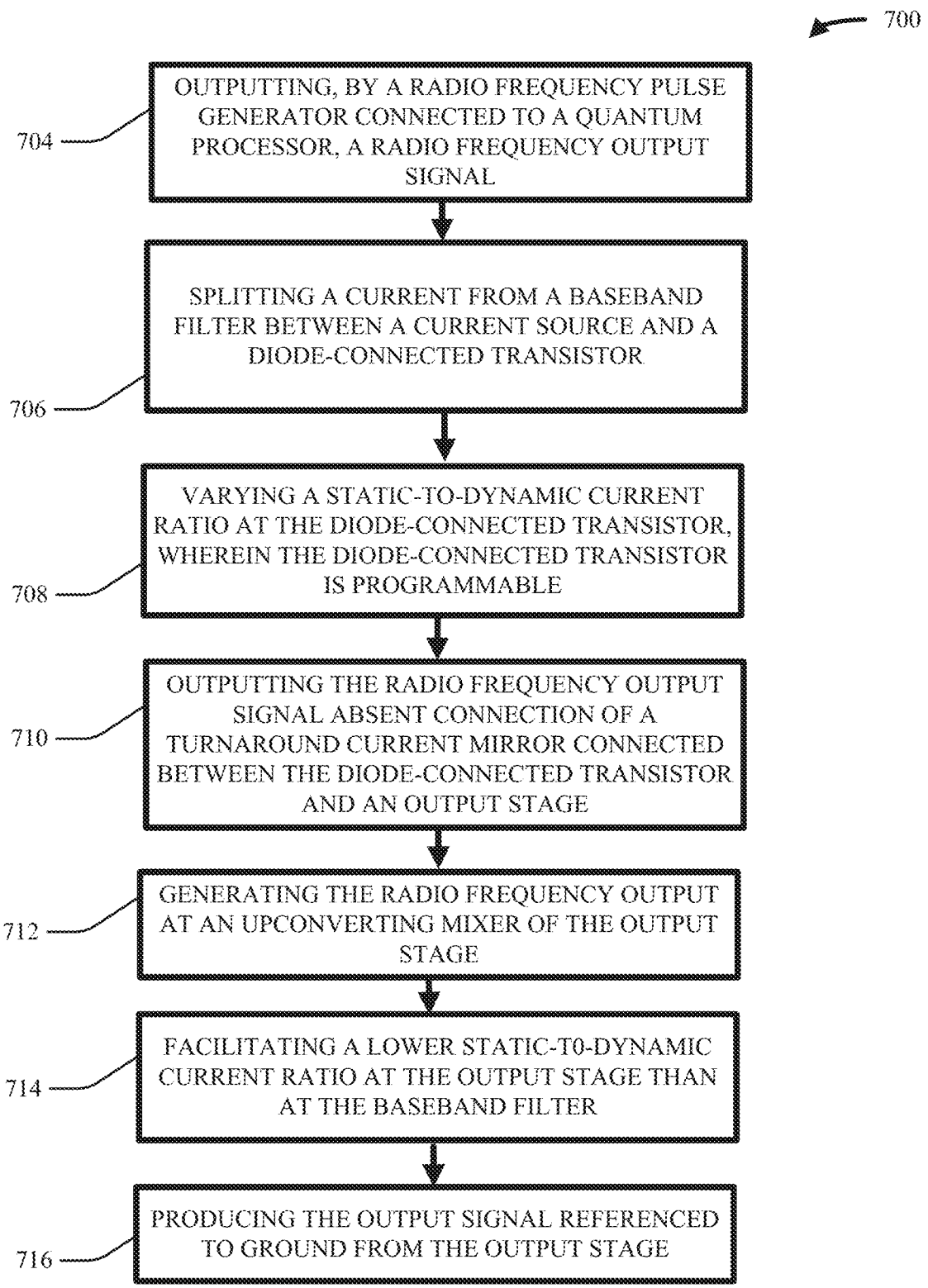
FIG. 7 illustrates a flow diagram of an example, non-limiting method that can facilitate use of a device, in accordance with one or more embodiments described herein.

Next, FIG. 7 illustrates a flow diagram of an example, non-limiting method 700 that can facilitate a process to use a current-mode signal path device in accordance with one or more embodiments described herein, such as the device 500 of FIG. 5. While the non-limiting method 700 is described relative to the device 500 of FIG. 5, the non-limiting method 700 can be applicable also to other systems and/or devices described herein, such as the waveform generator 110 of FIG. 1, system 200 of FIG. 2, and/or architecture 400 of FIG. 4. Repetitive description of like elements and/or processes employed in respective embodiments is omitted for sake of brevity.

At 704, the non-limiting method 700 can comprise outputting, by a radio frequency pulse generator (e.g., device 500) operatively coupled to a quantum processor, a radio frequency output signal, wherein the radio frequency pulse generator comprises a baseband filter and an output stage defining a current-mode signal path, and a current source and a diode-connected transistor arranged in parallel in the current-mode signal path.

At 706, the non-limiting method 700 can comprise splitting, by the device (e.g., device 500), a current from the baseband filter between the current source and the diode-connected transistor, which can comprise passing a static current at the current source and passing both a static current and a dynamic current at the diode-connected transistor.

At 708, the non-limiting method 700 can comprise varying, by the device (e.g. device 500) and/or by a parent system (e.g., quantum system 101), the static-to-dynamic current ratio at the diode-connected transistor, wherein the diode-connected transistor is programmable.

At 710, the non-limiting method 700 can comprise outputting the radio frequency output signal absent connection of a turnaround current mirror connected between the diode-connected transistor and the output stage.

At 712, the non-limiting method 700 can comprise generating, by the device (e.g., device 500), the radio frequency output at an upconverting mixer of the output stage.

At 714, the non-limiting method 700 can comprise facilitating, by the device (e.g., device 500), a lower static-to-dynamic current ratio at the output stage than at the baseband filter.

At 716, the non-limiting method 700 can comprise producing, by the device (e.g., device 500), the output signal referenced to ground from the output stage.

For simplicity of explanation, the computer-implemented and non-computer-implemented methodologies provided herein are depicted and/or described as a series of acts. The subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

In summary, one or more systems, devices and/or methods of use provided herein relate to a device that can facilitate a signal generation. A current-mode end-to-end signal path can include a digital to analog converter (DAC) operating in current-mode and an upconverting mixer, operating in current-mode and operatively coupled to the DAC. Analog inputs and analog outputs of the DAC and the upconverting mixer can be represented as currents, and the DAC can generate a baseband signal. In one or more embodiments, a current source and a diode-connected transistor can be arranged in parallel in the current-mode signal path between a baseband filter and an output stage comprising the upconverting mixer. The device and/or system can be a radio frequency DAC. The diode-connected transistor can be programmable to vary gain and/or can be directly connected to the output stage absent a turnaround current mirror connected therebetween.

An advantage of the aforementioned device can be ability to employ a lower ratio of static bias to signal current at the output stage as compared to as employed at the baseband filter. In connection therewith, current can be reused, power efficiency can be reduced, and distortion products can be reduced, relative to one or more embodiments of a DAC device not employing the parallel arrangement of a current source and a diode-connected transistor coupled in the current-mode signal path between the baseband filter and the output stage.

As a result of the aforementioned advantages, less power relative to operating one or more qubits of a quantum system can be employed. Reduced power consumption can allow for increased scaling of qubits of a quantum system. Furthermore, the components of the device and/or system can be employed within and/or relative to a cryogenic chamber, such as a dilution refrigerator.

Yet another advantage of the aforementioned device can be an ability to dynamically and/or selectively vary gain at the device, so that the gain of the current-mode signal path can be adjusted. The gain of the current-mode signal path can be adjusted over a large range and/or with fine resolution by programming the active width of the diode-connected transistor, as this changes the mirroring gain between the diode-connected transistor and the subsequent stage. This advantage can be realized absent a turnaround current mirror connected between the diode-connected transistor and the output stage.

Indeed, in view of the one or more embodiments described herein, a practical application of the devices described herein can be reduced power consumption and lower signal distortion relative to waveforms produced for controlling one or more qubits of a quantum system. Lower signal distortion can, in one or more cases, lead to less disturbances of a qubit and/or increase in qubit coherency. This is a useful and practical application of computers, especially in view of reduction of distortion and/or other effects on reducing decoherence of employed qubits, and thus facilitating enhanced (e.g., improved and/or optimized) operation of the employed qubits. These enhancements can include increased accuracy of quantum results and/or increased availability of the employed qubits. Overall, such computerized tools can constitute a concrete and tangible technical improvement in the field of quantum computing.

Furthermore, one or more embodiments described herein can be employed in a real-world system based on the disclosed teachings. For example, one or more embodiments described herein can function within a quantum system that can receive as input a quantum job request and can measure a real-world qubit state of one or more qubits, such as superconducting qubits, of the quantum system. For example, regarding a DAC device described herein, the DAC device can facilitate waveform generation relative to controlling one or more states of the one or more qubits.

Moreover, a device and/or method described herein can be implemented in one or more domains, such as quantum domains, to enable scaled quantum program executions. Indeed, use of a device as described herein can be scalable, such as where a device described herein can be employed to generate a waveform relative to one or more qubits of a multi-qubit system. An advantage of the device and/or method described herein can be a reduction in the power consumption needed to operate one or more qubits of a quantum system. Reduced power consumption can allow for increased scaling of qubits provided in a cryogenic chamber.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, provide program and/or program instruction execution, such as relative to RF signal generation and/or waveform generation, as compared to existing systems and/or techniques. Systems, computer-implemented methods and/or computer program products facilitating performance of these processes are of great utility in the field of quantum computing and superconducting quantum systems and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively alter a ratio of static bias to signal current and/or generate an RF signal and or waveform as the one or more embodiments described herein can facilitate this process. And, neither can the human mind nor a human with pen and paper electronically execute such RF signal and/or generation and/or alteration of static bias to signal current, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 8:
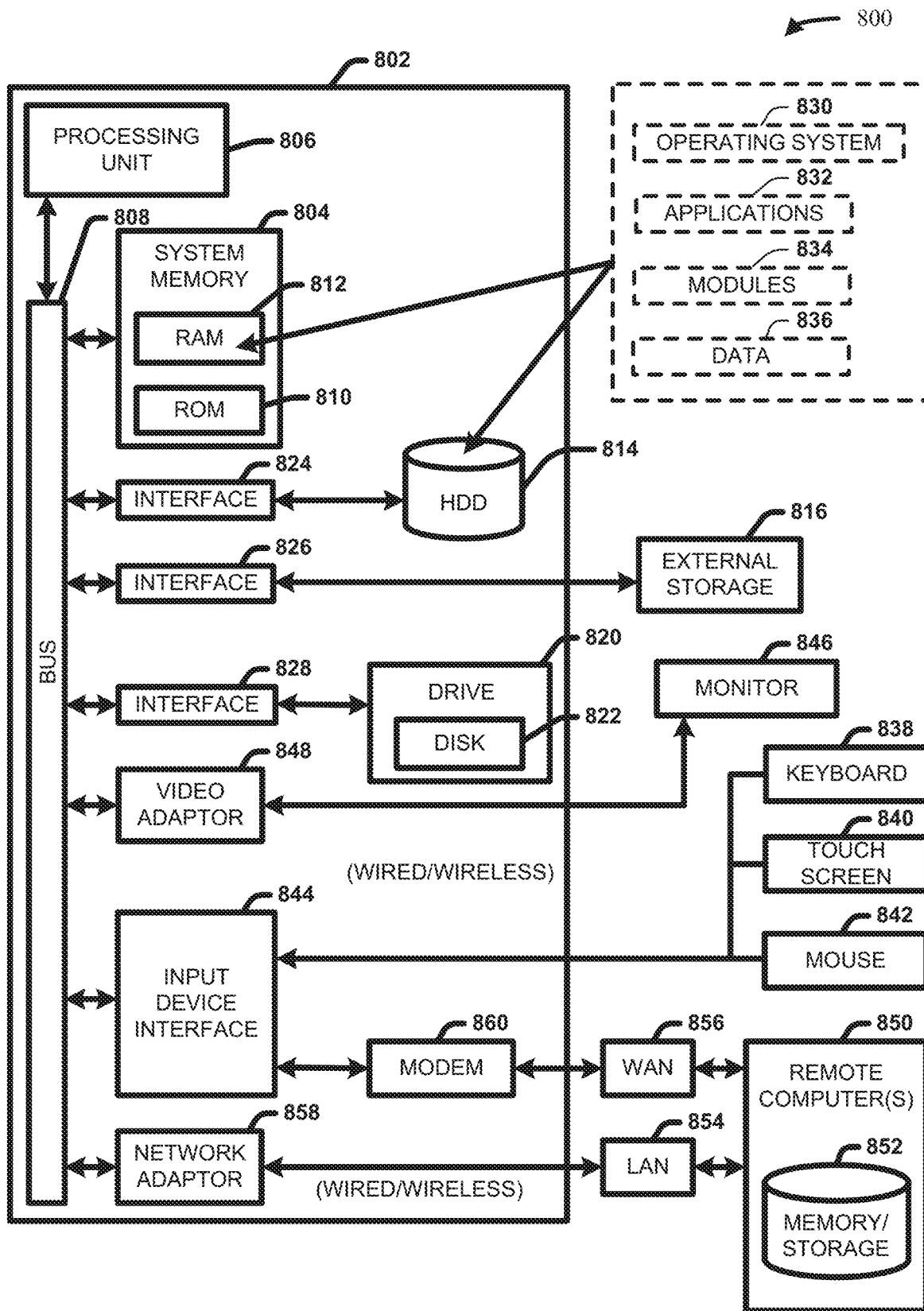
FIG. 8 illustrates a block diagram of an example, non-limiting, operating environment in which one or more embodiments described herein can be facilitated.
Figure 9:
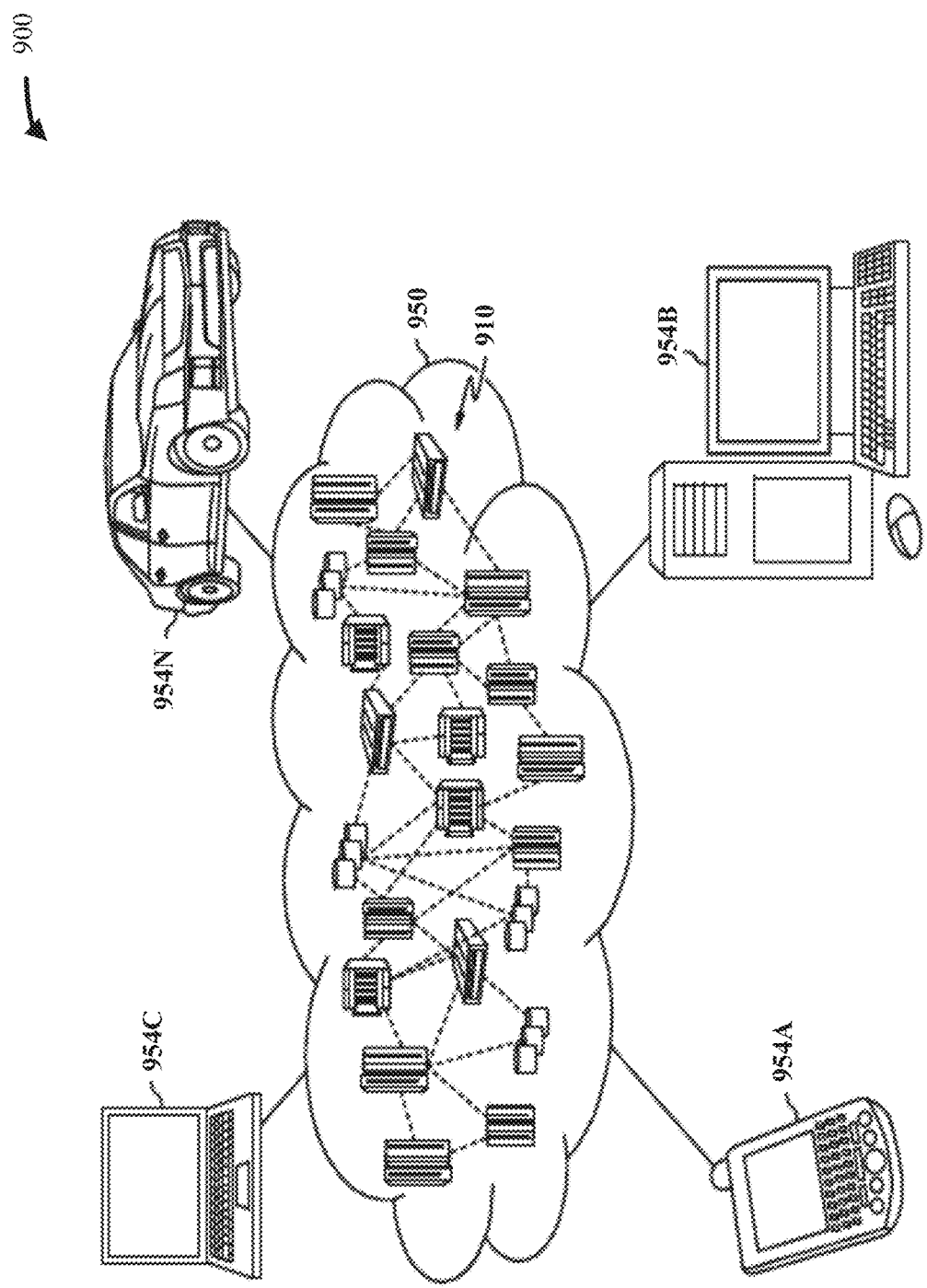
FIG. 9 illustrates a block diagram of an example, non-limiting, cloud computing environment in accordance with one or more embodiments described herein.
Figure 10:
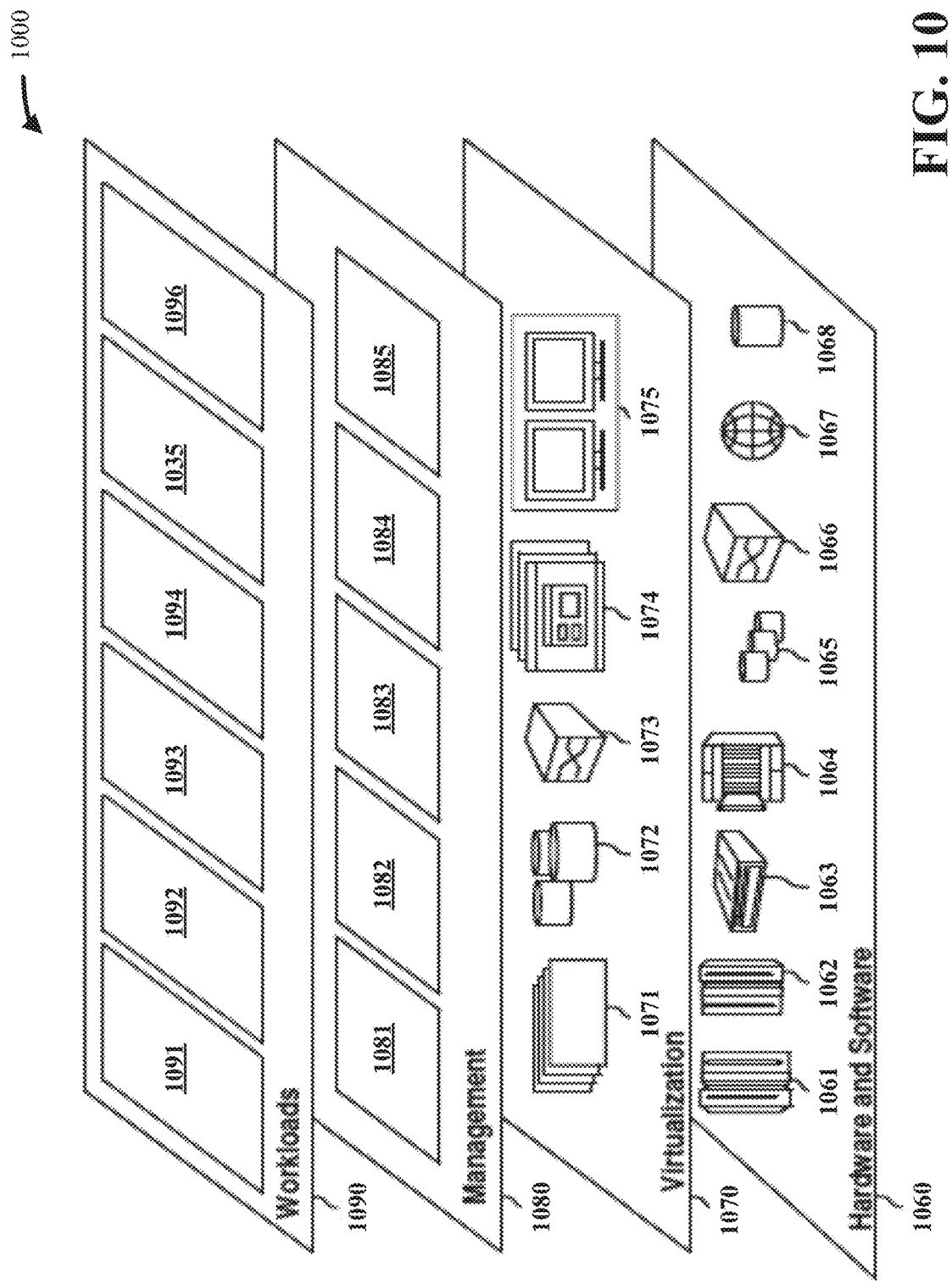
FIG. 10 illustrates a block diagram of example, non-limiting, abstraction model layers in accordance with one or more embodiments described herein.

Turning next to FIGS. 8-10, a detailed description is provided of additional context for the one or more embodiments described herein at FIGS. 1-7.

FIG. 8 and the following discussion are intended to provide a brief, general description of a suitable operating environment 800 in which one or more embodiments described herein at FIGS. 1-7 can be implemented. For example, one or more components and/or other elements of embodiments described herein can be implemented in or be associated with, such as accessible via, the operating environment 800. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the inventive methods can be practiced with other computer system configurations, including single-processor or multiprocessor computer systems, mini-computers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein, as applied to storage, memory and/or computer-readable media, can exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 8, the example operating environment 800 for implementing one or more embodiments of the elements described herein can include a computer 802, the computer 802 including a processing unit 806, a system memory 804 and/or a system bus 808. One or more elements, factors and/or functions of the processing unit 806 can be applied to processors such as 106 of the non-limiting system 100. The processing unit 806 can be implemented in combination with and/or alternatively to processors such as 106.

Memory 804 can store one or more computer and/or machine readable, writable and/or executable components and/or instructions that, when executed by processing unit 806 (e.g., a classical processor, a quantum controller and/or like processor), can facilitate performance of operations defined by the executable component(s) and/or instruction(s). For example, memory 804 can store computer and/or machine readable, writable and/or executable components and/or instructions that, when executed by processing unit 806, can facilitate execution of the one or more functions described herein relating to non-limiting system 100, as described herein with or without reference to the one or more figures of the one or more embodiments.

Memory 804 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 806 can comprise one or more types of processors and/or electronic circuitry (e.g., a classical processor, a quantum controller and/or like processor) that can implement one or more computer and/or machine readable, writable and/or executable components and/or instructions that can be stored at memory 804. For example, processing unit 806 can perform one or more operations that can be specified by computer and/or machine readable, writable and/or executable components and/or instructions including, but not limited to, logic, control, input/output (I/O), arithmetic and/or the like. In one or more embodiments, processing unit 806 can be any of one or more commercially available processors. In one or more embodiments, processing unit 806 can comprise one or more central processing unit, multi-core processor, microprocessor, dual microprocessors, microcontroller, System on a Chip (SOC), array processor, vector processor, quantum controller and/or another type of processor. The examples of processing unit 806 can be employed to implement one or more embodiments described herein.

The system bus 808 can couple system components including, but not limited to, the system memory 804 to the processing unit 806. The system bus 808 can comprise one or more types of bus structure that can further interconnect to a memory bus (with or without a memory controller), a peripheral bus and/or a local bus using one or more of a variety of commercially available bus architectures. The system memory 804 can include ROM 810 and/or RAM 812. A basic input/output system (BIOS) can be stored in a non-volatile memory such as ROM, erasable programmable read only memory (EPROM) and/or EEPROM, which BIOS contains the basic routines that help to transfer information among elements within the computer 802, such as during startup. The RAM 812 can include a high-speed RAM, such as static RAM for caching data.

The computer 802 can include an internal hard disk drive (HDD) 814 (e.g., EIDE, SATA), one or more external storage devices 816 (e.g., a magnetic floppy disk drive (FDD), a memory stick or flash drive reader, a memory card reader and/or the like) and/or a drive 820, e.g., such as a solid state drive or an optical disk drive, which can read or write from a disk 822, such as a CD-ROM disc, a DVD, a BD and/or the like. Additionally, and/or alternatively, where a solid state drive is involved, disk 822 could not be included, unless separate. While the internal HDD 814 is illustrated as located within the computer 802, the internal HDD 814 can also be configured for external use in a suitable chassis (not shown). Additionally, while not shown in operating environment 800, a solid state drive (SSD) can be used in addition to, or in place of, an HDD 814. The HDD 814, external storage device(s) 816 and drive 820 can be connected to the system bus 808 by an HDD interface 824, an external storage interface 826 and a drive interface 828, respectively. The HDD interface 824 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 802, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 812, including an operating system 830, one or more applications 832, other program modules 834 and/or program data 836. All or portions of the operating system, applications, modules and/or data can also be cached in the RAM 812. The systems and/or methods described herein can be implemented utilizing one or more commercially available operating systems and/or combinations of operating systems.

Computer 802 can optionally comprise emulation technologies. For example, a hypervisor (not shown) or other intermediary can emulate a hardware environment for operating system 830, and the emulated hardware can optionally be different from the hardware illustrated in FIG. 8. In a related embodiment, operating system 830 can comprise one virtual machine (VM) of multiple VMs hosted at computer 802. Furthermore, operating system 830 can provide runtime environments, such as the JAVA runtime environment or the .NET framework, for applications 832. Runtime environments are consistent execution environments that can allow applications 832 to run on any operating system that includes the runtime environment. Similarly, operating system 830 can support containers, and applications 832 can be in the form of containers, which are lightweight, standalone, executable packages of software that include, e.g., code, runtime, system tools, system libraries and/or settings for an application.

Further, computer 802 can be enabled with a security module, such as a trusted processing module (TPM). For instance, with a TPM, boot components hash next in time boot components and wait for a match of results to secured values before loading a next boot component. This process can take place at any layer in the code execution stack of computer 802, e.g., applied at application execution level and/or at operating system (OS) kernel level, thereby enabling security at any level of code execution.

An entity can enter and/or transmit commands and/or information into the computer 802 through one or more wired/wireless input devices, e.g., a keyboard 838, a touch screen 840 and/or a pointing device, such as a mouse 842. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera (s), a gesture sensor input device, a vision movement sensor input device, an emotion or facial detection device, a biometric input device, e.g., fingerprint and/or iris scanner, and/or the like. These and other input devices can be connected to the processing unit 806 through an input device interface 844 that can be coupled to the system bus 808, but can be connected by other interfaces, such as a parallel port, an IEEE 1394 serial port, a game port, a USB port, an IR interface, a BLUETOOTH® interface and/or the like.

A monitor 846 or other type of display device can be alternatively and/or additionally connected to the system bus 808 via an interface, such as a video adapter 848. In addition to the monitor 846, a computer typically includes other peripheral output devices (not shown), such as speakers, printers and/or the like.

The computer 802 can operate in a networked environment using logical connections via wired and/or wireless communications to one or more remote computers, such as a remote computer(s) 850. The remote computer(s) 850 can be a workstation, a server computer, a router, a personal computer, portable computer, microprocessor-based entertainment appliance, a peer device and/or other common network node, and typically includes many or all of the elements described relative to the computer 802, although, for purposes of brevity, only a memory/storage device 852 is illustrated. Additionally, and/or alternatively, the computer 802 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum controller and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 854 and/or larger networks, e.g., a wide area network (WAN) 856. LAN and WAN networking environments can be commonplace in offices and companies and can facilitate enterprise-wide computer networks, such as intranets, all of which can connect to a global communications network, e.g., the Internet.

When used in a LAN networking environment, the computer 802 can be connected to the local network 854 through a wired and/or wireless communication network interface or adapter 858. The adapter 858 can facilitate wired and/or wireless communication to the LAN 854, which can also include a wireless access point (AP) disposed thereon for communicating with the adapter 858 in a wireless mode.

When used in a WAN networking environment, the computer 802 can include a modem 860 and/or can be connected to a communications server on the WAN 856 via other means for establishing communications over the WAN 856, such as by way of the Internet. The modem 860, which can be internal and/or external and a wired and/or wireless device, can be connected to the system bus 808 via the input device interface 844. In a networked environment, program modules depicted relative to the computer 802 or portions thereof can be stored in the remote memory/storage device 852. The network connections shown are merely exemplary and one or more other means of establishing a communications link among the computers can be used.

When used in either a LAN or WAN networking environment, the computer 802 can access cloud storage systems or other network-based storage systems in addition to, and/or in place of, external storage devices 816 as described above, such as but not limited to, a network virtual machine providing one or more elements of storage and/or processing of information. Generally, a connection between the computer 802 and a cloud storage system can be established over a LAN 854 or WAN 856 e.g., by the adapter 858 or modem 860, respectively. Upon connecting the computer 802 to an associated cloud storage system, the external storage interface 826 can, such as with the aid of the adapter 858 and/or modem 860, manage storage provided by the cloud storage system as it would other types of external storage. For instance, the external storage interface 826 can be configured to provide access to cloud storage sources as if those sources were physically connected to the computer 802.

The computer 802 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 9, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 950 described below with reference to FIG. 9, and/or with reference to the one or more functional abstraction layers (e.g., quantum software and/or the like) described below with reference to FIG. 10, to execute one or more operations in accordance with one or more embodiments described herein. For example, cloud computing environment 950 and/or one or more of the functional abstraction layers 1060, 1070, 1080 and/or 1090 can comprise one or more classical computing devices (e.g., classical computer, classical processor, virtual machine, server and/or the like), quantum hardware and/or quantum software (e.g., quantum computing device, quantum computer, quantum controller, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

Although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as Follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 800 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 800 can be employed to use hardware and/or software to solve problems that are highly technical in nature, that are not abstract and/or that cannot be performed as a set of mental acts by a human.

Referring now to details of one or more elements illustrated at FIG. 9, the illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C and/or automobile computer system 954N can communicate. Although not illustrated in FIG. 9, cloud computing nodes 910 can further comprise a quantum platform (e.g., quantum computer, quantum hardware, quantum software and/or the like) with which local computing devices used by cloud consumers can communicate. Cloud computing nodes 910 can communicate with one another. They can be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. The types of computing devices 954A-N shown in FIG. 9 are intended to be illustrative only and that cloud computing nodes 910 and cloud computing environment 950 can communicate with any type of computerized device over any type of network and/or network addressable connection (e.g., using a web browser).

Referring now to details of one or more elements illustrated at FIG. 10, a set 1000 of functional abstraction layers is shown, such as provided by cloud computing environment 950 (FIG. 9). One or more embodiments described herein can be associated with, such as accessible via, one or more functional abstraction layers described below with reference to FIG. 10 (e.g., hardware and software layer 1060, virtualization layer 1070, management layer 1080 and/or workloads layer 1090). The components, layers and/or functions shown in FIG. 10 are intended to be illustrative only and embodiments described herein are not limited thereto. As depicted, the following layers and/or corresponding functions are provided:

Hardware and software layer 1060 can include hardware and software components. Examples of hardware components include: mainframes 1061; RISC (Reduced Instruction Set Computer) architecture-based servers 1062; servers 1063; blade servers 1064; storage devices 1065; and/or networks and/or networking components 1066. In one or more embodiments, software components can include network application server software 1067, quantum platform routing software 1068; and/or quantum software (not illustrated in FIG. 10).

Virtualization layer 1070 can provide an abstraction layer from which the following examples of virtual entities can be provided: virtual servers 1071; virtual storage 1072; virtual networks 1073, including virtual private networks; virtual applications and/or operating systems 1074; and/or virtual clients 1075.

In one example, management layer 1080 can provide the functions described below. Resource provisioning 1081 can provide dynamic procurement of computing resources and other resources that can be utilized to perform tasks within the cloud computing environment. Metering and Pricing 1082 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1083 can provide access to the cloud computing environment for consumers and system administrators. Service level management 1084 can provide cloud computing resource allocation and/or management such that required service levels are met. Service Level Agreement (SLA) planning and fulfillment 1085 can provide pre-arrangement for, and procurement of, cloud computing resources for which a future requirement is anticipated in accordance with an SLA.

Workloads layer 1090 can provide examples of functionality for which the cloud computing environment can be utilized. Non-limiting examples of workloads and functions which can be provided from this layer include: mapping and navigation 1091; software development and lifecycle management 1092; virtual classroom education delivery 1093; data analytics processing 1094; transaction processing 1095; and/or application transformation software 1096.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out one or more elements/portions of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform one or more portions of the one or more embodiments described herein.

One or more portions of the one or more embodiments described herein are described with reference to flowchart illustrations and/or block diagrams of methods, apparatus (systems), and computer program products according to one or more embodiments described herein. Each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement one or more portions of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated elements can also be practiced in distributed computing environments in which tasks are performed by remote processing devices that are linked through a communications network. However, one or more, if not all elements of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. A component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any element or design described herein as an "example" and/or "exemplary" is not necessarily to be construed as preferred or advantageous over other one or more elements and/or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A device, comprising:
    a baseband filter and an output stage defining a current-mode signal path; and
    a current ratio reduction device coupled to the baseband filter and coupled to the output stage, wherein the current ratio reduction device comprises a current source and a diode-connected transistor arranged in parallel in the current-mode signal path, wherein the current ratio reduction device is configured to split a static current output of the baseband filter into a first portion and a second portion, wherein the first portion is greater than the second portion, wherein the current ratio reduction device is further configured to direct the first portion of the static current output of the baseband filter to the current source and direct the second portion of the static current output of the baseband filter to the diode-connected transistor, wherein the current ratio reduction device is further configured to direct a dynamic current output of the baseband filter to the diode-connected transistor, wherein the diode-connected transistor is configured to direct the second portion of the static current output and the dynamic current output of the baseband filter to the output stage, wherein the current source is configured to prevent the first portion of the static current output of the baseband filter from being directed to the output stage, and wherein the diode-connected transistor is selectively adjustable to vary gain.

2. The device of claim 1, wherein the baseband filter is configured to have a first static-to-dynamic current ratio that is higher than a second static-to-dynamic current ratio of the output stage.

3. The device of claim 2, wherein the current source is programmable to tune a static-to-dynamic current ratio at the diode-connected transistor and at the output stage.

4. The device of claim 1, wherein the output stage comprises two or more transistors that are of a same negative type or a same positive type as a type of the diode-connected transistor.

5. The device of claim 4, wherein at least one of the two or more transistors of the output stage are selectively adjustable to vary gain.

6. The device of claim 1, wherein the diode-connected transistor is directly connected to the output stage absent a turnaround current mirror connected between the diode-connected transistor and the output stage.

7. The device of claim 1, wherein the output stage comprises:
an upconverting mixer that generates a radio frequency output signal.

8. A method, comprising:
receiving, by a radio frequency pulse generator operatively coupled to a quantum processor, a digital input signal; and
based on the digital input signal, outputting, by the radio frequency pulse generator, a radio frequency output signal, wherein the outputting comprises:
reducing, by a current ratio reduction device coupled to a baseband filter and an output stage defining a current-mode signal path of the radio frequency pulse generator, a second static-to-dynamic current ratio of the output stage to be below a first static-to-dynamic current ratio of the baseband filter, wherein the reducing comprises:
splitting, by the current ratio reduction device, a static current output of the baseband filter into a first portion and a second portion, wherein the first portion is greater than the second portion, wherein the current ratio reduction device is further configured to direct the first portion of the static current output of the baseband filter to a current source of the current ratio reduction device, and direct the second portion of the static current output of the baseband filter to the diode-connected transistor of the current ratio reduction device,
directing, by the current ratio reduction device, a dynamic current output of the baseband filter to the diode-connected transistor,
directing, by the diode-connected transistor, the second portion of the static current output and the dynamic current output of the baseband filter to the output stage,
preventing, by the current source, the first portion of the static current output of the baseband filter from being directed to the output stage,
wherein the current source and the diode-connected transistor are arranged in parallel in the current-mode signal path, and wherein the diode-connected transistor is programmable to vary gain.

9. The method of claim 8, further comprising:
varying, by the radio frequency pulse generator, the second static-to-dynamic current ratio at the diode-connected transistor.

10. The method of claim 8, further comprising:
outputting, by the radio frequency pulse generator, the radio frequency output signal absent connection of a turnaround current mirror connected between the diode-connected transistor and the output stage.

11. The method of claim 8, further comprising:
generating, by the radio frequency pulse generator, the radio frequency output signal at an upconverting mixer of the output stage.

12. The method of claim 8, wherein the diode-connected transistor is directly connected to the output stage absent a turnaround current mirror connected between the diode-connected transistor and the output stage.

13. The method of claim 8, further comprising:
producing, by the radio frequency pulse generator, the radio frequency output signal referenced to ground from the output stage.

14. A system, comprising:
a quantum controller; and
a radio frequency (RF) pulse generator controlled by the quantum controller, wherein the RF pulse generator comprises:
a baseband filter and an output stage defining a current-mode signal path, and
a current ratio reduction device coupled to the baseband filter and coupled to the output stage, wherein the current ratio reduction device comprises a current source and a diode-connected transistor arranged in parallel in the current-mode signal path, wherein the current ratio reduction device is configured to split a static current output of the baseband filter into a first portion and a second portion, wherein the first portion is greater than the second portion, wherein the current ratio reduction device is further configured to direct the first portion of the static current output of the baseband filter to the current source and direct the second portion of the static current output of the baseband filter to the diode-connected transistor, wherein the current ratio reduction device is further configured to direct a dynamic current output of the baseband filter to the diode-connected transistor, wherein the diode-connected transistor is configured to direct the second portion of the static current output and the dynamic current output of the baseband filter to the output stage, wherein the current source is configured to prevent the first portion of the static current output of the baseband filter from being directed to the output stage, and wherein the diode-connected transistor is directly connected to the output stage absent a turnaround current mirror connected between the diode-connected transistor and the output stage.

15. The system of claim 14, wherein the baseband filter is configured to have a first static-to-dynamic current ratio that is higher than a second static-to-dynamic current ratio of the output stage.

16. The system of claim 15, wherein at least one of the two or more transistors of the output stage are selectively adjustable to vary gain.

17. The system of claim 15, wherein the current source is programmable to tune a static-to-dynamic current ratio at the diode-connected transistor and at the output stage.

18. The system of claim 14, wherein the diode-connected transistor is programmable to vary gain.

19. The system of claim 14, wherein the output stage comprises two or more transistors that are of a same negative type or a same positive type as a type of the diode-connected transistor.

20. The system of claim 14, wherein the output stage comprises:
an upconverting mixer that generates a radio frequency output signal.

21. A device, comprising:
a baseband filter and an output stage defining a current-mode signal path; and
a current ratio reduction device coupled to the baseband filter and coupled to the output stage, wherein the current ratio reduction device comprises a current source and a programmable diode-connected transistor in the current-mode signal path, wherein the current ratio reduction device is configured to split a static current output of the baseband filter into a first portion and a second portion, wherein the first portion is greater than the second portion, wherein the current ratio reduction device is further configured to direct the first portion of the static current output of the baseband filter to the current source and direct the second portion of the static current output of the baseband filter to the programmable diode-connected transistor, wherein the current ratio reduction device is further configured to direct a dynamic current output of the baseband filter to the programmable diode-connected transistor, wherein the programmable diode-connected transistor is configured to direct the second portion of the static current output and the dynamic current output of the baseband filter to the output stage, and wherein the current source is configured to prevent the first portion of the static current output of the baseband filter from being directed to the output stage, wherein the output stage comprises a pair of parallelly connected output stage portions, and wherein the programmable diode-connected transistor is directly connected to one of the output stage portions.

22. The device of claim 21, wherein the baseband filter is configured to have a first static-to-dynamic current ratio that is higher than a second static-to-dynamic current ratio of the output stage.

23. A device, comprising:
a baseband filter and an output stage defining a current-mode signal path; and
a current ratio reduction device coupled to the baseband filter and coupled to the output stage, wherein the current ratio reduction device comprises a programmable current source and a programmable diode-connected transistor arranged in parallel in the current-mode signal path, wherein the current ratio reduction device is configured to split a static current output of the baseband filter into a first portion and a second portion, wherein the first portion is greater than the second portion, wherein the current ratio reduction device is further configured to direct the first portion of the static current output of the baseband filter to the programmable current source and direct the second portion of the static current output of the baseband filter to the programmable diode-connected transistor, wherein the current ratio reduction device is further configured to direct a dynamic current output of the baseband filter to the programmable diode-connected transistor, wherein the programmable diode-connected transistor is configured to direct the second portion of the static current output and the dynamic current output of the baseband filter to the output stage, and wherein the programmable current source is configured to prevent the first portion of the static current output of the baseband filter from being directed to the output stage,
wherein the programmable diode-connected transistor is directly connected to the output stage absent a turn-around current mirror connected between the programmable diode-connected transistor and the output stage.

24. The device of claim 23, wherein the baseband filter is configured to have a first static-to-dynamic current ratio that is higher than a second static-to-dynamic current ratio of the output stage.

25. The device of claim 23, wherein the output stage comprises two or more transistors that are of a same negative type or a same positive type as a type of the diode-connected transistor.

\* \* \* \* \*